(12) United States Patent
Knoppert et al.

(10) Patent No.: US 11,175,745 B2
(45) Date of Patent: Nov. 16, 2021

(54) SYSTEM AND METHOD FOR APPLICATION OF PIEZO ELECTRIC HAPTIC KEYBOARD PERSONAL TYPING PROFILE

(71) Applicant: Dell Products, LP, Round Rock, TX (US)

(72) Inventors: Michiel Knoppert, Amsterdam (NL); Priyank Gajiwala, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/777,906

(22) Filed: Jan. 31, 2020

(65) Prior Publication Data

US 2021/0240281 A1    Aug. 5, 2021

(51) Int. Cl.
*G06F 3/02* (2006.01)
*G06F 3/023* (2006.01)
(Continued)

(52) U.S. Cl.
CPC ............ *G06F 3/0202* (2013.01); *G06F 3/016* (2013.01); *G06F 3/023* (2013.01); *G06N 3/084* (2013.01);
(Continued)

(58) Field of Classification Search
CPC .. G06F 3/02; G06F 3/023; G06F 3/01; H01H 13/7065; H01H 13/83; H01H 13/85; H03K 17/967
See application file for complete search history.

(56) References Cited

U.S. PATENT DOCUMENTS

| 4,618,797 A | 10/1986 | Cline |
| 4,857,887 A | 8/1989 | Iten |

(Continued)

FOREIGN PATENT DOCUMENTS

| JP | 2014164610 A | 9/2014 |
| KR | 100442116 B1 | 7/2004 |

(Continued)

OTHER PUBLICATIONS

Rekimoto, J., et al., "PreSensell: Bi-directional Touch and Pressure Sensing Interactions with Tactile Feedback," Apr. 2006, 6 pages.

(Continued)

*Primary Examiner* — Pegeman Karimi
(74) *Attorney, Agent, or Firm* — Prol Intellectual Property Law, PLLC; H. Kenneth Prol

(57) ABSTRACT

A haptic keyboard typing profile personalization system of an information handling system comprising a processor to receive a plurality of haptic hardware typing behavior parameter values for a user via a piezo haptic keyboard controller and input the plurality of haptic hardware typing behavior parameter values into a personal typing profile comprising weight matrices of a machine learning neural network correlating the input with one or more haptic setting values defining haptic feedback movement one of a plurality of piezo electric elements of a haptic keyboard to identify an output describing the personal typing profile with learned, custom haptic setting values optimized for the user, and the piezo haptic keyboard controller applying a voltage of specific magnitude, polarity, or duration to the haptic keyboard to cause a piezo electric element to operate according to the personally typing profile learned, custom haptic setting values.

20 Claims, 8 Drawing Sheets

(51) Int. Cl.
*G06F 3/01* (2006.01)
*H01H 13/85* (2006.01)
*H03K 17/967* (2006.01)
*G06N 3/08* (2006.01)
*G06N 5/04* (2006.01)
*G06N 20/00* (2019.01)
*H01H 13/7065* (2006.01)

(52) U.S. Cl.
CPC ............ *G06N 5/046* (2013.01); *G06N 20/00* (2019.01); *H01H 13/7065* (2013.01); *H01H 13/85* (2013.01); *H03K 17/967* (2013.01); *H01H 2215/052* (2013.01)

(56) References Cited

U.S. PATENT DOCUMENTS

| | | |
|---|---|---|
| 5,463,388 A | 10/1995 | Boie |
| 5,825,352 A | 10/1998 | Bisset |
| 5,861,583 A | 1/1999 | Schediwy |
| 5,887,995 A | 3/1999 | Holehan |
| 6,147,680 A | 11/2000 | Tareev |
| 6,188,391 B1 | 2/2001 | Seely |
| 6,239,790 B1 | 5/2001 | Martinelli |
| 6,532,824 B1 | 3/2003 | Ueno |
| 6,574,095 B2 | 6/2003 | Suzuki |
| 6,680,731 B2 | 1/2004 | Gerpheide |
| 6,703,550 B2 | 3/2004 | Chu |
| 6,822,635 B2 | 11/2004 | Shahoian |
| 6,882,337 B2 | 4/2005 | Shetter |
| 7,336,260 B2 | 2/2008 | Martin |
| 7,439,962 B2 | 10/2008 | Reynolds |
| 7,486,279 B2 | 2/2009 | Wong |
| 7,523,410 B2 | 4/2009 | Rekimoto |
| 7,535,454 B2 | 5/2009 | Jasso |
| 7,741,979 B2 | 6/2010 | Schlosser |
| 7,808,488 B2 | 10/2010 | Martin |
| 8,144,453 B2 | 3/2012 | Brown |
| 8,159,461 B2 | 4/2012 | Martin |
| 8,164,573 B2 | 4/2012 | DaCosta |
| 8,199,033 B2 | 6/2012 | Peterson |
| 8,248,277 B2 | 8/2012 | Peterson |
| 8,248,278 B2 | 8/2012 | Schlosser |
| 8,279,052 B2 | 10/2012 | Heubel |
| 8,294,600 B2 | 10/2012 | Peterson |
| 8,294,677 B2 | 10/2012 | Wu |
| 8,373,664 B2 | 2/2013 | Wright |
| 8,477,113 B2 | 7/2013 | Wu |
| 8,508,487 B2 | 8/2013 | Schwesig |
| 8,542,134 B2 | 9/2013 | Peterson |
| 8,581,710 B2 | 11/2013 | Heubel |
| 8,633,916 B2 | 1/2014 | Bernstein |
| 8,674,941 B2 | 3/2014 | Casparian |
| 8,749,507 B2 | 6/2014 | DaCosta |
| 8,773,356 B2 | 7/2014 | Martin |
| 8,797,295 B2 | 8/2014 | Bernstein |
| 8,842,091 B2 | 9/2014 | Simmons |
| 9,178,509 B2 | 11/2015 | Bernstein |
| 9,268,927 B1 * | 2/2016 | Phoha .................. G06F 21/316 |
| 9,274,660 B2 | 3/2016 | Bernstein |
| 9,280,248 B2 | 3/2016 | Bernstein |
| 9,318,006 B2 | 4/2016 | Heubel |
| 9,336,969 B2 | 5/2016 | Takashima |
| 9,400,582 B2 | 7/2016 | Bernstein |
| 9,477,342 B2 | 10/2016 | Daverman |
| 9,535,557 B2 | 1/2017 | Bernstein |
| 9,829,982 B2 | 11/2017 | Bernstein |
| 10,089,840 B2 | 10/2018 | Moussette |
| 10,120,450 B2 | 11/2018 | Bernstein |
| 10,860,112 B1 | 12/2020 | Knoppert |
| 2006/0109255 A1 | 5/2006 | Chen |
| 2007/0063987 A1 | 3/2007 | Sato |
| 2007/0273671 A1 | 11/2007 | Zadesky |
| 2008/0098456 A1 | 4/2008 | Alward |
| 2008/0202824 A1 | 8/2008 | Philipp |
| 2008/0259046 A1 | 10/2008 | Carsanaro |
| 2009/0002178 A1 | 1/2009 | Guday |
| 2009/0243817 A1 | 10/2009 | Son |
| 2009/0315854 A1 | 12/2009 | Matsuo |
| 2010/0089735 A1 | 4/2010 | Takeda |
| 2010/0102830 A1 | 4/2010 | Curtis |
| 2010/0110018 A1 | 5/2010 | Faubert |
| 2010/0128002 A1 | 5/2010 | Stacy |
| 2012/0062491 A1 | 3/2012 | Coni |
| 2012/0092263 A1 | 4/2012 | Peterson |
| 2013/0021252 A1 * | 1/2013 | Lu .......................... G06F 3/0233 |
| | | 345/168 |
| 2013/0249802 A1 | 9/2013 | Yasutake |
| 2015/0185842 A1 | 7/2015 | Picciotto |
| 2017/0161629 A1 * | 6/2017 | Biswas ................... G06N 3/02 |
| 2017/0269688 A1 | 9/2017 | Chan |
| 2018/0074694 A1 | 3/2018 | Lehmann |
| 2018/0136737 A1 * | 5/2018 | Amarilio ................ H05B 45/10 |
| 2019/0073036 A1 | 3/2019 | Bernstein |

FOREIGN PATENT DOCUMENTS

| | | |
|---|---|---|
| KR | 20040081697 A | 9/2004 |
| WO | 2004/042685 A2 | 5/2004 |
| WO | 2004/042693 A1 | 5/2004 |
| WO | 2005/057546 A1 | 6/2005 |
| WO | 2011/056752 A1 | 5/2011 |
| WO | 2011/071837 A2 | 6/2011 |
| WO | WO-2019201704 A1 * | 10/2019 ........... H04L 9/3226 |

OTHER PUBLICATIONS

Rekimoto, J. et al., "PreSense: Interaction Techniques for Finger Sensing Input Devices," UIST '03 Vancouver, BC, Canada, Nov. 2003, pp. 203-212, ACM 1-58113-636-6/03/0010.

Holleis, P. et al., "Studying Applications for Touch-Enabled Mobile Phone Keypads," Proceedings of the Second International Conference on Tangible and Embedded Interaction (TEI'08), Feb. 18-20, 2008, Bonn, Germany, pp. 15-18.

Westerman, W. et al., "Multi-Touch: A New Tactile 2-D Gesture Interface for Human-Computer Interaction," Proceedings of the Human Factors and Ergonomics Society 45th Annual Meeting, Oct. 2001, pp. 632-636.

* cited by examiner

SYSTEM AND METHOD FOR APPLICATION OF PIEZO ELECTRIC HAPTIC KEYBOARD PERSONAL TYPING PROFILE

FIELD OF THE DISCLOSURE

The present disclosure generally relates to a keyboard assembly of information handling systems. The present disclosure more specifically relates to determining a piezo electric haptic keyboard personal typing profile for an individual user.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
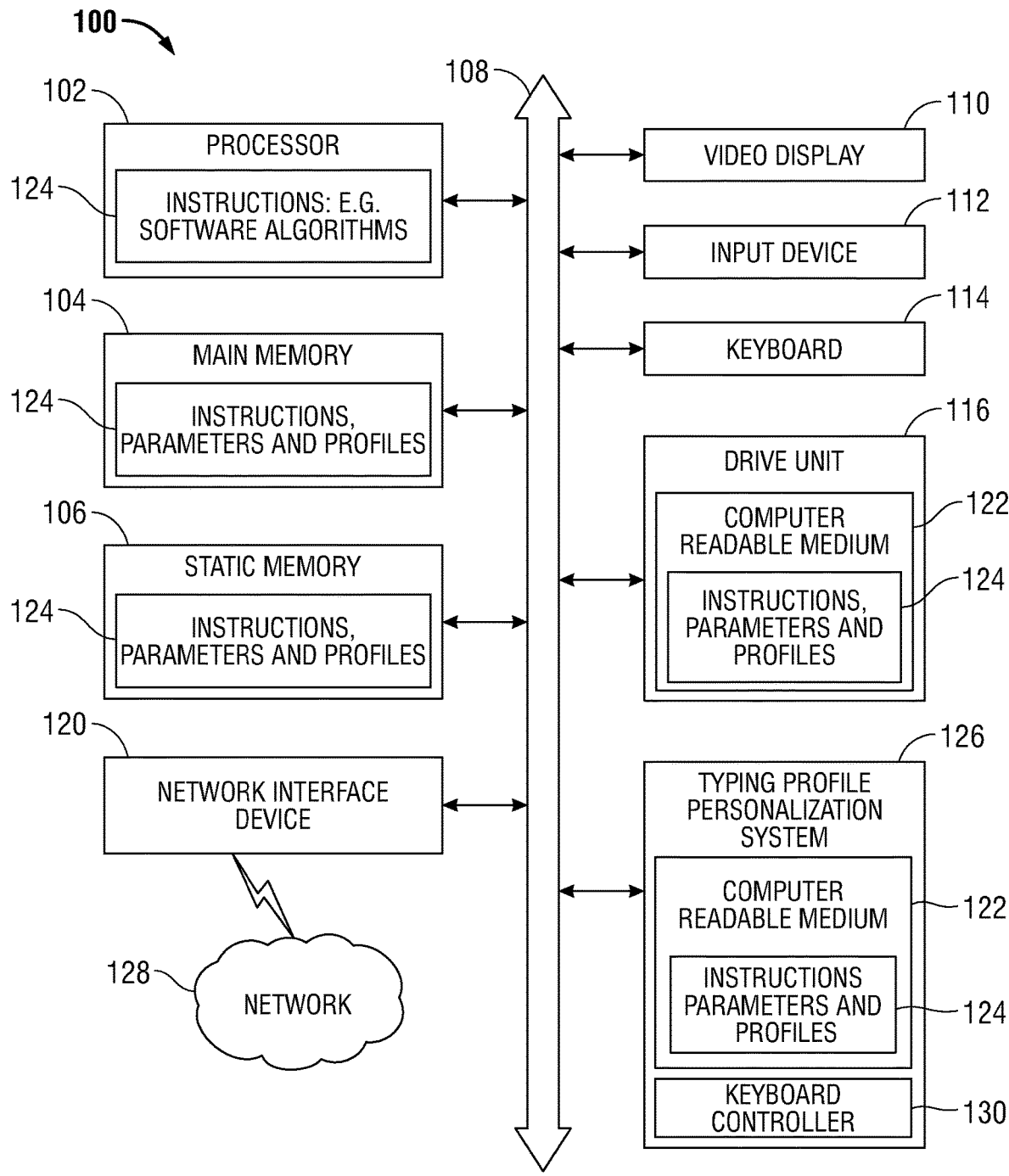
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

User demand drives the market for mobile information handling systems toward ever-slimmer, more lightweight laptop devices, prompting a need for ever-thinner keyboards and laptop bases. A solid-state piezoelectric keyboard provides a thinner, more light-weight improvement over traditional scissor mechanism keyboards. The use of piezoelectric elements within the keyboard may eliminate the use of other devices such as a scissor mechanism that are used to maintain a keycap of a key above an electrical connection or for a dive board type mechanism under a touchpad. Instead, such piezoelectric elements may reduce or eliminate those mechanical elements that may fail after a number of actuations while also reducing the thickness of the keyboard or the touchpad itself. Instead of the keys of the keyboard requiring travel of a scissor mechanism within a C-cover of the information handling system, the relatively thinner keys defined (either physically or visibly) on the solid-state keyboard of the presently-described information handling system may reduce the physical thickness of the keyboard within the information handling system. Further, the solid-state touchpad may eliminate the dive board mechanism and underlying click switch for selection of items via the mechanically actuated touchpad. This may enable a thinner, more streamlined information handling system.

Embodiments of the present disclosure provide for a keyboard of an information handling system. The keyboard may include, in an embodiment, a coversheet to identify an actuation location of an input actuation device. In an embodiment a support layer may be placed underneath the coversheet to support the coversheet and other layers within the keyboard. The keyboard may, in an embodiment, include a contact foil placed between the coversheet and support layer. In the embodiments presented herein, the keyboard may include a piezoelectric element placed between the contact foil and support layer to receive an applied mechanical stress at the actuation location of the input actuation device. The keyboard of the information handling system, in an embodiment, may include a controller of the information handling system operatively coupled to the contact foil to receive an electric charge from the piezoelectric element placed under the mechanical stress. The controller may also send an electric haptic control feedback signal to the piezoelectric element of a signal varying in polarity, voltage or current to cause the piezoelectric element to provide haptic feedback at the actuation location.

During operation of the solid-state keyboard or touchpad of the information handling system described in embodiments herein, a key on the keyboard or the touchpad may be actuated by a user pressing down on a specific location. In an embodiment, this specific location may be visually indicated by an alphanumeric symbol such as those found on a QWERTY keyboard, a key pedestal or raised location, or another designation such as a tactile frame or depression in a cover sheet. The actuations of these specific locations by, for example, a user's finger causes a mechanical stress to be applied to the piezoelectric element resulting in the deformation of the piezoelectric element. Upon application of this mechanical stress and the deformation of the piezoelectric element, the piezoelectric element accumulates an electric charge via a deformed piezoelectric material and that accumulated charge is passed to a controller of the information handling system via the contact foil described herein. In an embodiment, the controller receives the electrical charge and sends an electric haptic control feedback signal back to the piezoelectric element as a haptic control feedback signal to generate a haptic feedback event. Upon application of the electrical haptic control feedback signal of varying voltage or polarity on the piezoelectric element by the controller, the piezoelectric element may be mechanically stretched or compressed so as to create a haptic feedback event such as the piezoelectric element warping up or down and returning to its pre-deformed state. This warping of the layers of the piezoelectric element causes the user to feel a haptic sensation of a haptic feedback event at the actuated key or the specific location where the user pressed in order to actuate a key or touchpad. This haptic feedback against the user's finger causes a sensation of pressing a mechanical key in one example embodiment thereby creating a feeling to a user that the key was pressed or that a touchpad has been clicked to select an item such as one displayed on a display screen. In other example embodiments, the haptic sensation may be any haptic feedback event to a typing actuation or a touchpad actuation including vibration, clicks, bumps, shifts, or key or touchpad movement of any kind indicating actuation of the key or touchpad in various embodiment. The haptic sensation of the haptic feedback event may be adjusted or changed depending on the haptic control feedback signal sent in response to an actuation of a key location or a touchpad location.

By applying voltages of varying magnitude and polarity of a haptic control feedback signal to each of the piezo elements in a piezo haptic keyboard assembly in such a way, a controller may control the factors influencing a user's tactile experience, including the force she must use to depress a key, the speed and force with which each of the keycaps warps upward or downward and returns to its neutral position after being depressed in some embodiments. In embodiments herein a haptic keyboard and touchpad control system may be a set of instructions executed on the controller, the processor, or both to control either or both of the haptic keyboard or the haptic touchpad of the present embodiments. In other embodiments, the controller may also control the sound such an interaction generates. In contrast to conventional keyboard assemblies, each of these factors may be adjusted via the haptic control feedback signal, allowing for a wide range of tactile experiences. Further, in some embodiments, the haptic control feedback signal to the piezoelectric elements may further define an audio feedback experience for users. A method is needed to determine an optimal combination of these factors for a given user, in order to provide a personalized piezo haptic typing experience.

Embodiments of the present disclosure address this issue by developing a personal typing profile for a given user based on adjustable piezo element settings, observed dynamics of the piezo haptic keyboard assembly over time, observed environmental factors over time, or observed usage of applications over time. A controller operably connected to each of the piezo elements within a piezo haptic keyboard may receive instructions based on adjustable piezo element settings, and apply those settings to control the ways in which each of the piezo elements deflects in embodiments described herein. Again the controller may execute instructions of a haptic keyboard and touchpad control system alone or in coordination with a processor to receive and apply haptic keyboard settings, haptic touchpad settings, or both. In embodiments herein the haptic keyboard and touchpad control system may be separate systems for the haptic keyboard and for the haptic touchpad or may be one system for controls and operation of haptic feedback for both. For example, a controller operably attached to the piezo element may control or set the degree to which a piezo element must deform before it registers occurrence of a keystroke. More sensitive settings, requiring less deflection for keystroke detection may also cause keystrokes on the corners of keys to register as keystrokes. Less sensitive settings, requiring greater deflection for keystroke detection may decrease the surface area in which a user may apply force to cause the controller to detect a keystroke.

The controller in embodiments described herein may detect and transmit various metrics describing the dynamics of the piezo haptic keyboard assembly in use by a specific user over time to a typing profile personalization system. Such user behavior metrics may include the force of keystrokes, the location of keystrokes (e.g., in the center of a given key or in the corner of that key), duration of keystrokes, and overall typing speed, for example. The typing profile personalization system in embodiments described herein may also receive input from a variety of environmental sensors describing the surrounding environment of the information handling system over time. Such sensors may include, for example, a camera, a location sensor, a network interface device, or a microphone. In addition, the typing profile personalization system may access logs indicating usage of various applications over time. In such a way, the typing profile personalization system in embodiments described herein may gather information describing the ways in which a user interacts with the piezo haptic keyboard, the applications the user is actively using, and the user's physical surroundings, at any given time.

The typing profile personalization system in embodiments described herein may analyze this gathered information to identify correlations between a user's interaction with the piezo haptic keyboard, the haptic settings for the keyboard, the applications used, and the physical surroundings. Once the typing profile personalization system applies a machine learning methodology to determine such correlations in embodiments described herein, the typing profile personalization system may detect changes to any of these influencing factors and either suggest or automatically apply changes to one or more of the factors controlling the user's haptic experience of the piezo haptic keyboard assembly. For example, the typing profile personalization system in embodiments described herein may detect the user prefers to apply less force to the keys, and receive less haptic feedback following a keystroke when the user reviews and replies to e-mails from home in the evenings. As another example, the typing profile personalization system in embodiments may detect the user prefers to apply greater force, decrease the detection of corner strikes, and receive greater haptic feedback for a longer duration when playing video games in an online gaming forum at night. As yet another example, the typing profile personalization system in an embodiment may determine the user wishes the piezo haptic keyboard assembly to be as silent as possible during typing when the user is actively using a video-conferencing application during working hours. By monitoring such information, suggesting changes based on such correlations, and continuing to receive user feedback (e.g., accepting or receiving suggested changes), the typing profile personalization system in embodiments described herein may develop a personalized typing profile for individual users and cause a controller for any piezo haptic keyboard assembly to operate according to that user's personalized typing profile.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O) devices 112, such as a keyboard 114, a touchpad, a mouse, a video/graphic display 110, or any combination thereof. The information handling system 100 may also include one or more buses operable to transmit communications between the various hardware components. Portions of an information handling system 100 may themselves be considered information handling systems 100.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 122 storing instructions 124 of the typing profile personalization system 132, and drive unit 116 (volatile (e.g. random-access memory, etc.), nonvolatile memory (read-only memory, flash memory etc.) or any combination thereof. The information handling system 100 may also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad, or gesture or touch screen input), and a keyboard 114. Various drivers and control electronics may be operatively coupled to operate input devices 112 such as the haptic keyboard 114 and haptic touchpad according to the embodiments described herein.

The network interface device shown as wireless adapter 120 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both licensed and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz).

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller such as keyboard controller 130 or a processor system 102. Further, in an exemplary, non-limited embodiment, implementations may include distributed processing, component/object distributed processing, and parallel processing. Alternatively, virtual computer system processing may be constructed to implement one or more of the methods or functionalities as described herein. Executable code of a haptic keyboard and touchpad control system may receive and apply settings for the haptic keyboard 114 or haptic touchpad operation and one system may administer both or there may be separate systems for each. The executable code of the haptic keyboard and touchpad control system may also operate the determination of actuation and provision of haptic feedback events with the haptic keyboard 114 or haptic touchpad operation. Further, the executable code of the haptic keyboard and touchpad control system may receive scan codes from actuation of key areas of a haptic keyboard 114 and register an alphanumeric character associated with such a key or receive activation signals of a haptic touchpad and register a selection in embodiments herein. Additionally, a typing profile personalization system 132 may be executable code operating on either a keyboard controller 130, processor 102, or some combination to determine the typing profiling and settings of embodiments herein. In some embodiments the typing profile personalization system 132 may be a part of haptic keyboard and touchpad control system or may be a separate system operating on controller 130, processor 102, or both.

The present disclosure contemplates a computer-readable medium that includes instructions, parameters, and profiles 124 or receives and executes instructions, parameters, and profiles 124 responsive to a propagated signal, so that a device connected to a network 128 may communicate voice, video or data over the network 128. Further, the instructions 124 may be transmitted or received over the network 128 via the network interface device or wireless adapter 120.

The information handling system 100 may include a set of instructions 124 that may be executed to cause the computer system to perform any one or more of the methods or computer-based functions disclosed herein. For example, instructions 124 may execute a typing profile personalization system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the typing profile personalization system 132 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124 including haptic feedback modulation instructions that allow for a user to input a desired level of haptic feedback at a key or location on a touchpad. The disk drive unit 116 and static memory 106 may also contain space for data storage. Further, the instructions 124 may embody one or more of the methods or logic as described herein. For example, instructions relating to the typing profile personalization system 132 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RANI (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The typing profile personalization system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the typing profile personalization system 132 that may be operably connected to the bus 108. The typing profile personalization system 132 computer readable medium 122 may also contain space for data storage. The typing profile personalization system 132 may, according to the present description, perform tasks related to transmitting an electric haptic control feedback signal to a piezoelectric element based on learned, custom optimal haptic settings for a specific user, causing a haptic feedback at a key of the keyboard 114 associated with that piezoelectric element. In these embodiments, the typing profile personalization system 132 may transmit an electric charge to any of a plurality of piezoelectric elements each associated with a key on keyboard 114 (i.e., a QWERTY keyboard), a key pad, or a location on a touchpad.

In an embodiment of the present description, each of the keys of keyboard 114 may be associated with a piezoelectric element. The piezoelectric element may be used to, as described herein, create an electrical charge relative to a key on the keyboard 114 and send that electrical charge to a controller 130. In an embodiment, the controller 130 may receive the electrical charge and send an electrical haptic control feedback signal in response to the piezoelectric element. Upon application of the electrical haptic control feedback signal at the piezoelectric element (i.e., having a specific current, voltage, and polarity) associated with the actuated key of keyboard 114 causes the piezoelectric element to convert that electric haptic control feedback signal into a mechanical warping by, for example, stretching or compressing the piezoelectric material and warping a metallic disk of the piezoelectric element. The mechanical warping upward or downward of the piezoelectric element due to the application of the electrical haptic control feedback signal to the piezoelectric element may be felt as a haptic feedback event by a user who actuated the key of keyboard 114 and may depend on the duration, frequency, magnitude, and polarity of the haptic control feedback signal.

In an embodiment, the keyboard controller 130 may execute instructions, parameter, and profiles 124 to implement the functions of the keyboard 114 as described herein via a haptic keyboard and touchpad control system and a typing profile personalization system 132. The typing profile personalization system 132 in an embodiment may include one or more sets of instructions that, when executed by a keyboard controller 130, processor 102, or both, causes a haptic response control signal at varying voltage levels and polarity to be applied to a piezoelectric element upon detection of an electrical charge indicating deformation and a keypress from the piezoelectric element. The one or more sets of instructions of the typing profile personalization system 132 may also include one or more sets of instructions that, when executed by the keyboard controller 130, determines which of any plurality of keys of keyboard 114 were activated. In an example, the keyboard controller 130 may receive, from a piezoelectric element, an electric charge and produce an electric haptic control feedback signal to the piezoelectric element.

In an embodiment, the typing profile personalization system 132 may also include one or more sets of instructions that, when executed by a processor, adjusts the polarity, voltage, or current of haptic control feedback signals applied to any piezoelectric element. This adjustment may be completed based on the desired, custom, or learned haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the electric haptic control feedback signal applied any given piezoelectric element by the keyboard controller 130 may be customized to produce a specific level of haptic feedback at any given key of keyboard 114. In an embodiment, the keyboard controller 130 of the information handling system 100 may include a look-up table. In this embodiment, the keyboard controller 130 of the information handling system 100 may access the look-up table in order to determine how a current pulse is to be applied to any given piezoelectric element and at what polarity or voltage of the haptic control feedback signal to the piezoelectric elements.

The one or more sets of instructions of the typing profile personalization system 132 may also include one or more sets of instructions that, when executed by the keyboard controller 130, causes any number of subsequent current pulses to be applied to any piezoelectric element. In this embodiment, the subsequent electrical pulses may cause a haptic feedback event to a user who actuated a key of keyboard 114 or changes in magnitude or pulses of haptic feedback to emulate the feel of a mechanical keystroke including adjustment of the feel of depth of the haptic-emulated keystroke. In other embodiments, the haptic feedback of the keyboard 114 may not need to emulate a keystroke of a mechanically actuated keyboard but instead provide a distinct haptic feel to indicate that a keystroke has occurred on the solid-state keyboard 114 to the user.

In an embodiment, the typing profile personalization system 132 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2:
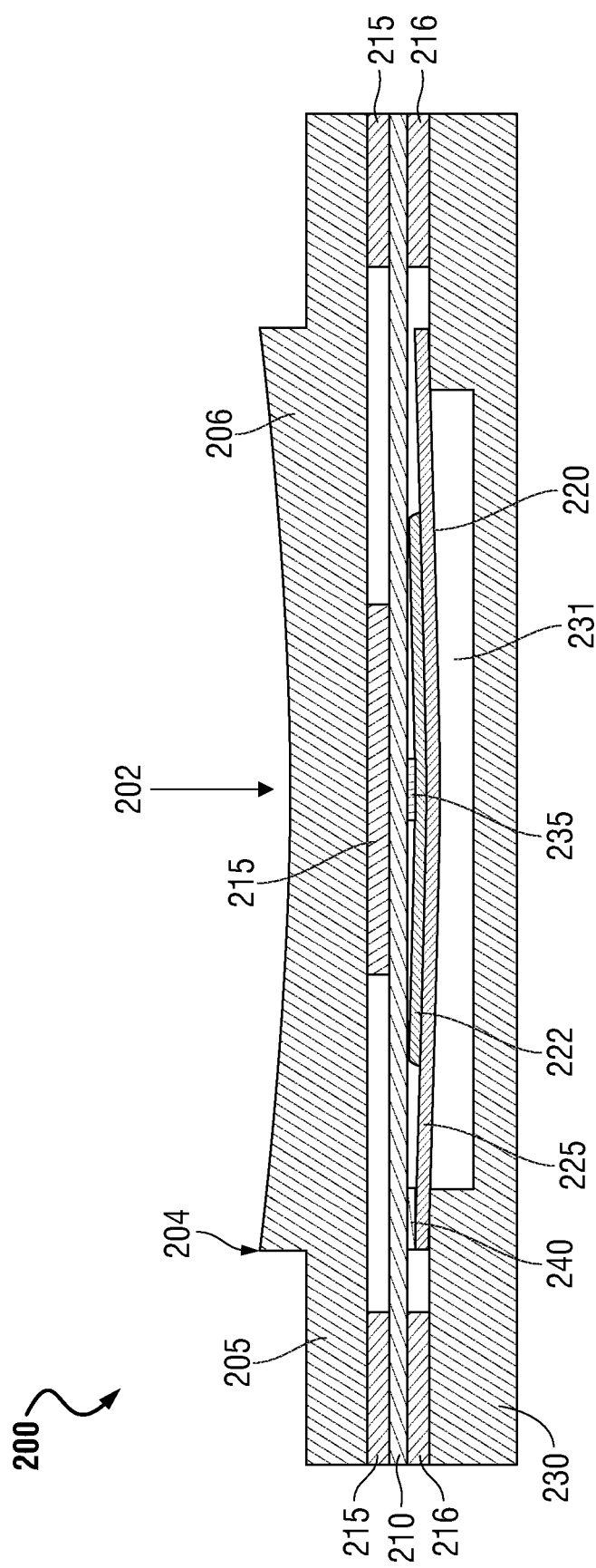
FIG. 2 is cross-sectional graphical view of a piezo haptic keyboard layer stack according to an embodiment of the present disclosure.

FIG. 2 is a side cut-out view of a key 200 of a keyboard implementing a piezoelectric element deforming under pressure applied by a user according to an embodiment of the present disclosure. As described herein, user demand drives the market for mobile information handling systems toward ever-slimmer, more lightweight laptop devices, prompting a need for every-thinner keyboards. In order to decrease the thickness of laptop systems, keyboards may employ piezo haptic technology that is slimmer than tradition mechanical keyboard systems. In an example embodiment, the keyboard with piezo haptic technology may mimic the tactile sensation of traditional mechanical keyboards, but may replace a key cap, scissor mechanism, and rubber dome of a traditional mechanical key assembly with a keyboard cover sheet lying atop a deformable piezo element layer.

According to an embodiment, the key 200 may be formed of a plurality of layers, one layer of which is a piezoelectric element 220. Although FIG. 2 shows a cross-sectional view of a single key 200, the present specification contemplates that a keyboard may also include a plurality of these similar keys 200 arranged as, for example, a QWERTY-type keyboard. The present specification also contemplates that, in addition to a keyboard, an information handling system described herein may also include a touchpad including a piezoelectric element 220 as described herein. Consequently, FIG. 2 is not intended to be limiting but merely intended as a description of operation of any type of input device contemplated by the present disclosure.

The key 200 includes a coversheet 205. The coversheet 205 may be made of any type of elastically resilient material. The elastically resilient material may allow, at least, a portion of the key 200 to be deformed upon application of a pressure from a user's finger. Upon withdrawal of the pressure from the user's finger, the material the coversheet 205 is made of allows the coversheet 205 of the key 200 to bend back to its pre-deformed state. In an embodiment, the resilient material may allow the coversheet 205 to travel a minimal distance and still deform a piezoelectric element 220. For example, a distance of between 0.01 mm and 2 mm. In an embodiment, the distance is between 0.05 mm and 0.15 mm. In an embodiment, the distance is 0.1 mm.

In an embodiment, the shape of the coversheet 205 may have a selection of key pedestals 206 of various sizes and shaped so as to conform to a user's finger. In an embodiment, in order to shape the coversheet 205, the material used to form the coversheet 205 may be subjected to an injection molding process. As such, a top portion of the coversheet 205 may be formed to be ergonomically beneficial to a user's actuation such as by conforming to the user's fingers and including a pedestal 206 to highlight the key location, for example. In other embodiments, no key pedestals may be formed and a key location may be described in coversheet 205 via markings, depressions, key framing, or other methods. The injection molding process may be completed prior to the installation of the coversheet 205 into the remaining layers within the keyboard 200 as described herein. Any number of processes may be included with the injection molding process. In an embodiment, the injection molding process used to form the coversheet 205 may include forming a number of holes within a sheet of acrylonitrile butadiene styrene (ABS). These holes may correlate with a number of keys on a keyboard. The formation of the coversheet 205 may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard.

In other embodiments, the coversheet of the C-cover may include a plurality of vias for keys 200 having a cover sheet 205 or cap for each key. A key pedestal 206 for each key 200 in a solid-state keyboard of the present embodiments may be disposed through the vias in the C-cover in such embodiments. Each haptic key of the haptic keyboard in such an embodiment may include a cover layer similar to those described directly above that protrudes through the key vias in the coversheet 205. Layering under the coversheet may include material layers that are hydrophobic or have other properties. Though gaps between haptic keys and key vias may be minimized, such gaps may be useful for cooling ventilation of the base chassis or for allowing backlighting to frame the haptic keys. Similarly, a touchpad top touch interface layer may be attached under the coversheet 205 to seamlessly provide a designated touchpad area in the C-cover coversheet for access to the top cover sheet 205 of the solid state touchpad in some embodiments. Any combination of a continuous coversheet for haptic keys and vias in the coversheet for placement of haptic keys of a keyboard coversheet layer are contemplated in various embodiments. Further, it is contemplated that in some embodiments one or the other of a haptic keyboard or haptic touchpad may be used with a keyboard having mechanically actuated keys or a touchpad with a mechanically actuated diving board mechanism.

The key 200 may further include a number of adhesive layers 215 that physically couple the various layers of the key 200 together. In an embodiment, a first adhesive layer 215 may be formed on the coversheet 205 to adhere the coversheet 205 to the contact foil 210. The first adhesive layer 215 may include the placement of the adhesive at locations that may enhance the movement and prevent the hindrance of the actuation of the coversheet 205. In a specific embodiment, the first adhesive layer 215 may include placing the adhesive along borders of the key 200 as well as placing the adhesive at a central location of the key 200.

The contact foil 210 may be made of any elastically resilient material that, when the coversheet 205 of key 200 is actuated or the contact foil 210 is bent towards a lower portion of the key 200, returns to its original state when the key 200 is no longer being actuated. The contact foil in an embodiment may be a flexible material, such as polyethylene terephthalate (PET) serving as a polyester printed circuit board or other type of flexible printed circuit board, in several example embodiments. The contact foil 210 may include a number of metal traces formed on one or more of its surfaces that electrically and communicatively couple each of the corresponding piezoelectric element 220 of key 200 to a keyboard controller such as a processor of an information handling system that includes a haptic feedback keyboard control system such as described herein. Formation of metal traces may be made according to a variety of methods including photolithographic techniques for applying metal or lamination of copper strips or other metal layers.

In an embodiment, portions of the contact foil 210 may be physically coupled to a support plate 230 via a second layer of adhesive 216. The location of the placement of the second adhesive layer 216 may include placing the adhesive along borders of the key 200.

In an embodiment presented herein, the piezoelectric element 220 may include a first portion 222 that may be any solid piezoelectric material that accumulates an electric charge when a mechanical stress is applied to it or specifically, in the embodiments presented herein, when the solid material is deformed. Solid materials used to form the piezoelectric element 220 may include crystals, ceramics, or protein layers, among other types of materials. For ease of explanation, the piezoelectric element 220 may be made of a type of ceramic although the present specification contemplates the use of other types of piezoelectric materials.

The piezoelectric element 220 may be housed over a cavity 231 formed in the support plate 230. The piezoelectric element 220 may comprise two portions 222 and 225 each electrically coupled via electric contact points such as soldering points 235 and 240, respectively, to a different electrical trace on the bottom surface of the contact foil 210. The first portion 222 may be a ceramic disc in an embodiment. Second portion 225 of the piezoelectric element 220 may be a metal plate or ring, such as a brass plate, that extends beyond the edges of cavity 231. The first portion 222 and the second portion 225 may be operatively coupled via adhesive including conductive adhesives. The soldering points 235 and 240 may be silver solder contact points for operative electrical coupling to metal traces on the bottom surface of contact foil 210. As so oriented, the first soldering point 235 and second soldering point 240 may be formed to receive an electrical charge upon deflection of the piezoelectric element 220 as a user actuates the key 200. The brass plate 225 supports deflection of the piezoelectric element 220 into the cavity 231 to detect mechanical actuation of the key 200. In an embodiment, the support plate 230 may have a cavity 230 formed therein such that the piezoelectric element 220 may be allowed to be deflected therein when the key 200 is actuated by a user and cavity 231 may be an aperture or hole through support plate 230 or may be a depression or hole in support plate 230 that does not pass through 230.

In an embodiment presented herein, the piezoelectric element 220 may be any solid material that accumulates an electric charge when a mechanical stress is applied to it or specifically, in the embodiments presented herein, the solid material is deformed. Solid materials used to form the piezoelectric disk 222 or other piezoelectric material as part of a first portion 222 of the piezoelectric element 220 may include crystals, ceramics, biological matter, protein layers, among other types of materials. For ease of explanation, the piezoelectric disk material 222 may be made of a type of ceramic although the present specification contemplates the use of these other types of materials.

During operation of the key 200, the contact foil 210 may receive an electrical charge from the piezoelectric element 220 at the metal traces on the bottom surface of the contact foil 210 that conduct the electrical charge to the processor or other keyboard controller associated with the key 200. For example, as the piezoelectric disk material 222 is compressed by deflection and the metal plate or ring 225 warped downward toward the cavity 231 within support plate 230, a change in voltage may be detected. The electrical charge created when the user actuates the key 200 and the piezoelectric element 220 is subjected to a mechanical stress may be detected between soldering points 235 and 240. The electrical charge may be communicated down metal traces formed on the contact foil 210 to a controller (not shown).

The metal traces formed on the contact foil 210 may further be used to conduct a return electric haptic control feedback signal from the controller to the piezoelectric element 220 so that the voltage and current of the return electric haptic control feedback signal may cause the piezoelectric element 220 to return to a planer and rigid piezoelectric element 220 as required to cause a specified haptic response to the user via coversheet 205. For example, this electric haptic control feedback signal may have a certain voltage, current, and polarity (−,+) sufficient to render the piezoelectric material of the piezoelectric element 220 to cause a haptic event or sound. Such a response signal may be a sine wave, a square wave, a pulsed signal, or other waveform of changing current, voltage, or polarity applied to the piezoelectric element 220. This stiffening of the piezoelectric element 220 may cause a haptic feedback presented at the key 200 via the contact foil 210, adhesive 215, and coversheet 205 that the user may feel. Upon receiving an actuation signal, the controller sends an electric haptic control feedback signal back to the piezoelectric element 220 via the metal traces formed on the contact foil 210, through the soldering points 235 and 240 and to a conductive layer of metallic plate or ring 225 formed below the piezoelectric disk material 222.

Upon receiving an actuation signal, the controller sends an electric haptic control feedback signal back to the piezoelectric element 220 via the metal traces formed on the contact foil 210, through the soldering points 235 and 240 and to a conductive layer of metallic plate or ring 225 formed below the piezoelectric disk material 222. The conductive layer of metallic plate or ring 225 may apply the electric haptic control feedback signal to the piezoelectric disk material 222 so as to cause the piezoelectric disk material 222 to stretch or shrink depending on the polarity of the signal applied. For example, a negative signal applied to piezoelectric disk material element 222 relative to the charge at adhesively attached metallic plate 225 may cause piezoelectric disk 222 to expand or stretch in embodiments herein. This may cause metallic plate 225 to warp downward. Reversing polarity to the piezoelectric disk 222 may cause the piezoelectric disk 222 to compress or shrink and metallic plate 225 may warp upwards. The principle of haptics applied to the piezoelectric disk 222 includes an input voltage that is applied through the two electrodes (voltage change as sine wave, square wave etc.) to generate movement on piezoelectric material 222 of the piezoelectric element 220 and a warping of the metallic layer or disk 225.

This haptic control feedback signal is used to cause a haptic tactile feedback such as a depression and return of the key 200 or a haptic "click" of a touchpad and which may be accompanied by a sound. Such an electric haptic control feedback signal, such as a sine wave signal, or other haptic control feedback signals with varying polarities or voltage and current may be used by the keyboard controller to create the haptic feedback felt by the user as described herein. In these embodiments, the electric charge sent from the piezo-electric element 220 to the keyboard controller and the electric haptic control feedback signal sent from the controller to the piezoelectric element 220 may propagate along the two metal traces formed on the bottom surface of the contact foil 210. The contact foil 210 may therefore, in an embodiment, include double the number of metal traces on its bottom surface as that of the number of piezoelectric elements 220 used to form a keyboard that includes multiple keys 200. This haptic feedback may be relayed to the user within microseconds of the user actuating the key 200 such that the user physically detects a sensation that the key 200 was pressed. This sensation felt by the user may be present despite no actual mechanical devices such as a scissor mechanism or other types of keyboard mechanical devices being present among the layers of the key 200. The signal to the piezoelectric element 220 may vary magnitude and pulsing to create the desired haptic response at key 200.

In some embodiments, the controller may apply a series of voltage pulses to the piezo electric element 220, via the contact foil 210, causing the piezo element 220 to vibrate, pulse, or move between its upward warped, downward warped, or neutral positions over a preset time period. In one embodiment, the controller may adjust the downward force 202 required to register a keystroke by increasing the threshold value of voltage the controller must receive in order to detect occurrence of a keystroke. This may, in turn require a greater deflection of the piezo element 220 in order to generate such a higher magnitude of voltage.

The controller applying voltages to the contact foil 210 in such an embodiment may control several factors describing the dynamics of the haptic keyboard assembly. For example, by setting a baseline voltage applied to the piezo element 220 to slightly deform the piezo element 220 in an embodiment, or increasing the threshold voltage received at the controller necessary to register a keystroke, the controller may set the downward force required to register a keystroke, as well as roughly define the area (e.g., in the center of the key, or on the edges of the key) in which a user must apply that force. A corner strike 204 may be less likely to cause optimal deflection of the piezo element 220, in comparison to application of downward pressure 202 directly in the middle of the piezo element 220. Because such a corner strike 204 causes the piezo element 220 to deflect less than a pointed, center key strike would, a user performing a corner strike 204 in an embodiment may need to provide greater downward force in the corner strike 204 to cause the controller to register a keystroke has occurred. In this way, sensitivity of the piezo-electric keyboard may also be set.

As another example, the controller may set the intensity or force with which a key provides a haptic response following a keystroke by causing the piezo element 220 to rotate between its upward warping, downward warping, and neutral position. In other words, the controller may set the cycle of movement, pulsing, and intensity of the piezo element 220 movement by adjusting the amplitude, polarity, pulsing, or waveform of the haptic control feedback signal provided to a piezo electric element 220. The controller in another example may set the duration of such a haptic response by adjusting the period of haptic response, or the duration of time between detection of the keystroke and deflection of the piezo element 220. Movement or vibration sharpness in an embodiment may refer to the amount of time that is allowed to pass between detection of a keystroke and initiation of a haptic response. For example, a controller in an embodiment may receive a voltage generated at the solder points 235 and 240 via the contact foil 210 when the piezo element 220 warps downward under user-applied force, and may respond by transmitting a haptic voltage signal causing the piezo element 220 to warp upward, or to move between upward and downward warped positions. The controller in such an embodiment may affect the sharpness of a vibration by allowing a shorter or longer time period to elapse between receipt of the voltage indicating the piezo element 220 has been deformed downward under user-applied pressure and transmission of the responsive haptic voltage signal causing the haptic movement (e.g. upward or downward warping) of the piezo element 220. The haptic response may be a vibration, a click, a depression followed by an upward motion, or a more nuanced movement invoked by the piezo-electric element 220.

The controller in some embodiments may also cause a piezo element 220 to vibrate or otherwise move in response to a haptic response control signal for a prolonged period, in a burst under certain conditions. For example, certain keys may be used as hot keys or controller keys for certain applications in an embodiments. A user playing a video game may use the "F" key to fire a weapon, for example. In some embodiments, the controller may set these hot buttons or controller keys to deliver such a burst or prolonged vibration in response to certain instructions received from the corresponding application (e.g., computer game). For example, the "F" key used to fire a weapon in an embodiment may deliver a burst of vibration or another movement when the weapon the user is attempting to fire is out of ammunition. In another example embodiment, the piezo element 220 situated beneath the touchpad may deliver a burst vibration to indicate the player has been injured. The controller in such embodiments may control the duration of such bursts, and the interval between the bursts by setting the number of voltage pulses, and the timing between them that the contact foil 210 applies to the piezo element 220.

The controller applying voltages to the contact foil 210 in an embodiment may control the several factors describing the dynamics of each piezo element 220, individually, in such a way. In other words, the controller in an embodiment may apply different piezo haptic settings to different piezo elements, operating simultaneously. For example, piezo elements situated beneath two separate keys may operate according to separate dynamics, based on voltages applied by the controller, separately, to each of those piezo elements. As another example, piezo elements situated beneath the touch pad may operate according to separate dynamics than piezo elements situated beneath keys on the cover sheet 205. In still another example, piezo elements situated in one region of the touch pad may operate according to separate dynamics than piezo elements situated beneath another region of the touch pad.

FIG. 2 shows an image of a single key 200. The present specification contemplates that a plurality of keys 200 may be formed alongside each other in order to form, for example, a number pad, a keyboard, or a combination thereof. Consequently, although the features of the key 200 depicted in FIG. 2 apply to a single key 200, the present specification contemplates that any number of keys 200 may be formed on the keyboard so as to allow for the formation of an input device such as a keyboard. The keys 200 may be of any size (e.g., spacebar, tab key, or the like) and depending on size may include more than one piezoelectric element 220 associated with it. As the user actuates each of the keys 200, a haptic feedback may be felt by the user so as to present to the user a sensation that the key was pressed. This operation of key 200 may be conducted every time the user actuates the key 200.

The formation of the key 200 may, in the embodiments presented herein, provide for a keyboard that has a relatively shorter distance of key travel as compared to those keyboards that implement mechanical devices such as a scissor mechanisms and key caps. In an embodiment, the distance of travel of the key 200 may be smaller than 0.1 mm. With the shorter distance of key travel, the overall thickness of the keyboard placed within an information handling system may be reduced. This increases the available footprint within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. This reduction in size of the information handling system may also result in the reduction of the weight of the information handling system thereby increasing the portability of the information handling system by the user.

The keys 200 of the present embodiments also include no moving mechanical parts. With the absence of mechanical moving parts, the key 200 of the presently described embodiments may be relatively more robust thereby increasing the useful life of the key 200. This may increase user satisfaction over the useful lifetime of the information handling system.

Figure 3:
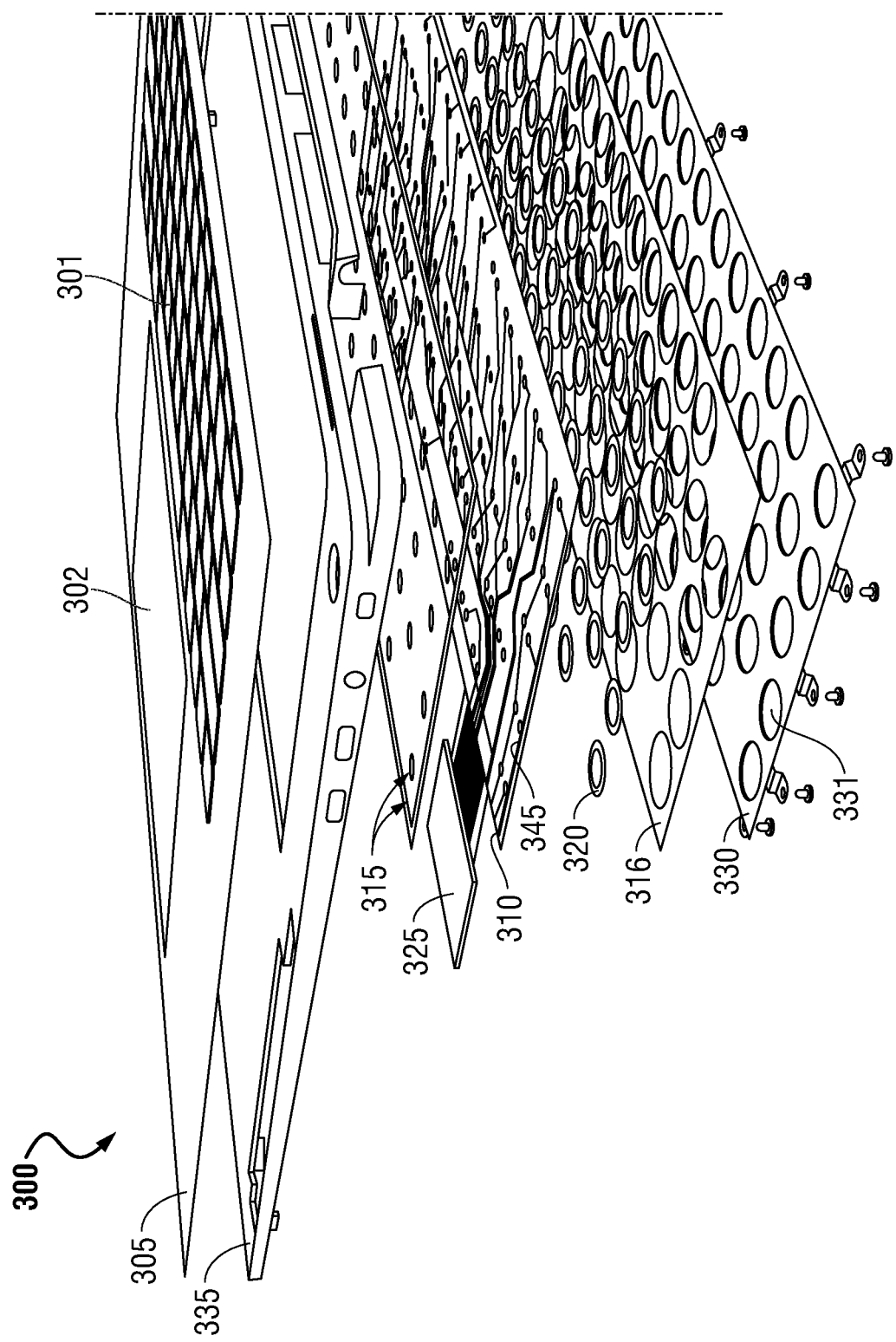
FIG. 3 is an exploded perspective graphical view of a piezo haptic keyboard layer stack according to an embodiment of the present disclosure.

FIG. 3 is an exploded perspective graphical view of a piezo haptic keyboard layer stack including a controller setting and recording various dynamics of a plurality of piezo electric elements according to an embodiment of the present disclosure. The keyboard stack up 300 shows a plurality of keys, similar to those described in connection with FIG. 2, arranged so as to receive input from a user at multiple keys. FIG. 3 also shows a top coversheet 305 having both a keyboard 301 and a touchpad 302. Either or both of the keyboard 301 and touchpad 302 may be haptic systems as described in embodiments herein. In an embodiment, the keys may be arranged similar to a QWERTY design of a keyboard 301. However, other arrangements of any alphabetic, numeric, or symbolic keys are contemplated by the present description.

The keyboard stack up 300 may include several layers similar to those described in connection with FIG. 2. In an embodiment, the keyboard stack up 300 includes a coversheet layer 305. The coversheet layer 305 may be made of any type of elastically resilient material. Coversheet layer 305 may include a plurality of key designations, such as key pedestals as shown in keyboard 301 and a touchpad 302 area designation. The elastically resilient material may allow, at least, a portion of the coversheet layer 305 to be deformed upon application of a pressure from a user's finger. Upon withdrawal of the pressure from the user's finger, the material the coversheet layer 305 is made of allows the coversheet layer 305 of the key to bend back to its pre-deformed form. In an embodiment, the resilient material may allow the coversheet layer 305 to travel a distance of between 0.01 mm and 2 mm.

In an embodiment, the shape of the coversheet layer 305 may be such so as to conform to the user's fingers. In an embodiment, in order to shape the coversheet 305, the material used to form the coversheet 305 may be subjected to an injection molding process. As such, a top portion of the coversheet layer 305 may be formed to be ergonomically beneficial to a user's actuation such as by providing a tactile key location designation and conforming to the user's fingers, for example. The injection molding process may be completed prior to the installation of the coversheet 305 into the remaining layers within the keyboard 300 as described herein. Any number of processes may be included with the injection molding process, including forming a number of holes correlated with a number of keys 301 on the keyboard 300 within sheet of ABS, and injection molding a translucent ABS through the holes to form a raised portion correlating with each of the number of keys 301 on the keyboard 300. Opposite the raised portions a number of runners may be machined away to accommodate for receipt of other layers of the keyboard such as each of the piezoelectric elements 320.

In other embodiments, the coversheet of the C-cover 335 may include a plurality of vias for keys 301 having a cover sheet 305 or cap for each key 301. A key pedestal for each key 301 in a solid-state keyboard of the present embodiments may be disposed through the vias in the C-cover 335 in some example embodiments. Similarly, it is contemplated that coversheet layer 305 may include a touchpad via as a window for a touchpad interface surface of a solid state touchpad according to embodiments. Each haptic key of the haptic keyboard in such an embodiment may include a cover layer similar to those described directly above that protrudes through the key vias in the coversheet 305. Layering under the coversheet may include material layers that are hydrophobic or have other properties. Though gaps between haptic keys and key vias may be minimized, such gaps may be useful for cooling ventilation of the base chassis or for allowing backlighting to frame the haptic keys. Similarly, a touchpad 302 top touch interface layer may be attached under the coversheet 305 to seamlessly provide a designated touchpad area in the C-cover 335 coversheet 305. Any combination of a continuous coversheet for haptic keys and vias in the coversheet for placement of haptic keys of a keyboard coversheet layer 305 are contemplated in various embodiments. Further, it is contemplated that in some embodiments one or the other of a haptic keyboard or haptic touchpad may be used with a keyboard 300 having mechanically actuated keys 301 or a touchpad 302 with a mechanically actuated diving board mechanism. Any combination of the above coversheet 305 layouts described is contemplated in embodiments described herein.

The keyboard stack up 300 may further include a C-cover substructure 335 forming part of the base chassis with a cutout for keyboard 301 and touchpad 302. The C-cover substructure 335 may be made of a rigid material that prevents little or no movement. The rigidity of the C-cover substructure 335 allows the other layers within the keyboard 301 to be maintained within the information handling system. In an embodiment, the C-cover substructure 335 may be made of a metal.

The keyboard stack up 300, in an embodiment, may further include any number of adhesive layers 315. In an embodiment, a first adhesive layer 315 may mechanically couple the coversheet layer 305 to a contact foil layer 310. The first adhesive layer 315 may include the placement of the adhesive at locations that may enhance the movement and prevent the hindrance of the actuation of the coversheet layer 305 at those locations across the coversheet layer 305 where keys are present. In a specific embodiment, the first adhesive layer 315 may include placing the adhesive along borders of each of the keys as well as placing the adhesive at a central location of each of the keys.

The contact foil layer 310 is adhered to the coversheet layer 305 via the first adhesive layer 315 may be made of any elastically resilient material that, when any given key is actuated or the contact foil layer 310 is bent towards a lower portion of the respective key, returns to its original state when the respective key is no longer being actuated. The contact foil layer 310 may include a number of metal traces 345 formed on one or more of its surfaces that electrically and communicatively couples each of the keys and a corresponding piezoelectric element 320 to a keyboard controller 326 of an information handling system that includes a haptic feedback keyboard control system such as described in connection with FIG. 1. In an embodiment, the keyboard controller 326 may be a dedicated controller communicatively coupled to the contact foil layer 310 so as to detect electrical charges from each of the piezoelectric elements 320 and provide electric haptic control feedback signals back to the respective piezoelectric elements 320. The keyboard controller 326 may execute code instructions for a haptic keyboard and touchpad control system and a typing profile personalization system as described in FIG. 1 alone or in combination with a processor of the information handling system. In an alternative embodiment, the keyboard controller 326 may be a processor of the information handling system that, among other computations and execution of other computer readable program code, also executes computer readable program code associated with the typing profile personalization system as described in FIG. 1.

During operation of each key on the keyboard 301, the contact foil layer 310 may receive an electrical charge from the respective piezoelectric elements 320 as they are compressed upon actuation at the metal traces 345 that conduct the electrical charge to the controller 325 associated with the keyboard 300. The metal traces 345 formed on the contact foil layer 310 may further be used to conduct a return electrical haptic control feedback signal from the controller 325 to the piezoelectric elements 320 so that the voltage and current of the return electric haptic control feedback signal may cause the piezoelectric elements 320 to stretch or contract in response to a control haptic feedback signal and at varying polarities, voltages, or currents. This electrical response control signal to of each of the actuated piezoelectric elements 320 may cause a haptic feedback presented at each of the keys that the user may feel. This haptic feedback may be relayed to the user within microseconds of the user actuating any of the keys on the keyboard 301 such that the user physically detects a sensation that the key was pressed. This sensation felt by the user may be present despite no actual mechanical devices such as a scissor mechanism or other types of keyboard mechanical devices being present among the layers of the keyboard 301.

The keyboard stack up 300 may further include a second adhesive layer 316 that mechanically couples the contact foil layer 310 to a support plate 330. In an embodiment, the second adhesive layer 316 may include the placement of an adhesive along borders of each piezoelectric element 320 of the keyboard stack up 300. As shown in FIG. 3, the second adhesive layer 316 includes circular voids that conform to a shape of each piezoelectric element 320 within the keyboard stack up 300.

The support plate 330 may be made of rigid material such as a metal. The support plate 330 prevents deformation of the keyboard stack up 300 except for, in some embodiments, the contact foil layer 310, piezoelectric element 320, first adhesive layer 315, and second adhesive layer 316 as for operation of the haptic keys. As such, the contact foil layer 310 may be allowed to detect the deformation of the piezoelectric elements 320. Additionally, a user using the keyboard 301 may feel a level of rigidity in the keyboard 301 except that at the locations of the keys where the user has expected that some level of deformation occurs when pressure is applied to provide for key actuation of the piezoelectric element 320.

In an embodiment, the support plate 330 may include a number of cavities 331 formed therein. The cavities 331 may be sized to have a relatively smaller diameter than the diameter of each of the respective piezoelectric elements 320. By including these cavities 331, the piezoelectric elements 320 may be allowed to be deformed into the cavities 331 so that the deformation of the piezoelectric element 320 creates the electrical charge described herein. The metal plate of the piezoelectric elements 320 may have a diameter greater than cavities 331. Upon compression or contraction of the piezoelectric material portions, such as a ceramic disk of the piezoelectric element 320, the metal plate may warp into or away from the cavity 331. The depth of the cavities 331 may also be selected to allow for at least a central portion of each piezoelectric element 320 to be deflected into the cavities 331 some distance. This distance of deflection, in an embodiment, may be 0.1 mm or smaller or may be greater. In an embodiment, the cavities 331 may also be holes punched or machined through the support plate 330.

In an embodiment, the support plate 330 may be secured to other rigid elements of the information handling system. In an embodiment, the support plate 330 may be secured to the C-cover substrate 335 via a number of bolts, screws, or other mechanical or chemical coupling device. In some embodiments, the support plate 330 may be operatively coupled to the D-cover of the information handling system.

Each of the piezoelectric elements 320 may include a first portion layer of piezoelectric material and a second portion conductive layer as described herein in connection with the larger figures describing the keys in FIG. 2. Additionally, each piezoelectric element 320 of the keyboard 301 may be operatively coupled to at least one metal trace 345 formed on the contact foil layer 310 via a contact point such as a solder point. The contact foil layer 310 may, in a particular embodiment, include two metal traces 345 for each piezoelectric element 320 at a first portion and a second portion formed in the keyboard 301.

During operation of the keyboard 301, a user may actuate a key formed on the coversheet layer 305 of the keyboard 301 by pressing down on that key. As a result of the mechanical stress placed on the piezoelectric material of the piezoelectric element 320 associated with the actuated key, an electric charge is created at the piezoelectric element 320. The electrical charge is carried to one or more metal traces 345 coupled to the piezoelectric material and the metal plate of the piezoelectric element 320 via a contact point such as a solder point. The electric charge received at the one or more metal traces 345 may be conducted to a controller 325 by the metal trace 345 as described herein.

In an embodiment, the controller 325 may detect that electrical charge produced by the mechanical stress of the piezoelectric material of the piezoelectric element 320 and send an electric haptic control feedback signal back to the piezoelectric material of the piezoelectric element 320. This electric haptic control feedback signal may have a certain voltage, current, and polarity (−,+) sufficient to render the piezoelectric material of the piezoelectric element 320 to cause a haptic event, movement, or sound. The electric haptic control feedback signal from the controller 325 may follow the same or a different metal trace 345 back to the piezoelectric element 320. The electric haptic control feedback signal may be received at the piezoelectric material and metal plate of the piezoelectric element 320 via, for example, a contact point such as a solder point. Because the piezoelectric material of the piezoelectric element 320 receives the electric haptic control feedback signal from the controller 325 this causes the piezoelectric material to generate a haptic event.

A response signal may be a sine wave, a square wave, a pulsed signal, or other waveform of changing current, voltage, or polarity applied to the piezoelectric element 320. As a result of the piezoelectric material stretching or contracting during the haptic event, the piezoelectric element 320 warp downward or upward with respect to the cavity 331 and may return back to a non-deformed state, thereby creating haptic feedback felt by the user's finger. In an embodiment, the relay of the electrical charge to the controller 325, the detection of the controller 325 of the electrical charge, and the return of the electric haptic control feedback signal by the controller 325 to the piezoelectric element 320 may be sufficiently quick enough for the user to feel the haptic feedback in a manner that the user does not detect any temporal delay between the actuation of the key and the detection of the haptic feedback created at the piezoelectric element 320. In an embodiment, the relay of the electrical charge to the controller 325, the detection of the controller 325 of the electrical charge, and the return of the electric haptic control feedback signal by the controller 325 to the piezoelectric element 320 may be on the order of microseconds. This operation of each of the keys of the keyboard 301 may be conducted every time the user actuates any key on the keyboard 301.

By applying voltage to each of the piezo elements 320 in a piezo haptic keyboard assembly, the controller 325 in an embodiment may control the factors influencing a user's tactile experience, including detecting any application of force applied to a key or touchpad. In some embodiments, the piezo elements 320 and controller 325 may control the amount of force a user must use to depress a key 301 or the touch pad 302 on the cover sheet 305, the speed and force with which each of the keycaps 301 returns to their neutral positions after being depressed, and the sound such an interaction generates, among other factors. In contrast to conventional keyboard assemblies, each of these factors may be adjusted, allowing for a wide range of tactile experiences for users via adjustment of a haptic response control signal to the piezo elements 320.

The controller 325 may receive instructions based on adjustable piezo element settings, and apply those settings to control the ways in which each of the piezo elements 320 in the piezo element layer deflects. For example, the controller 325 may control or set the degree to which a piezo element 320 in the piezo element layer must deform before it registers occurrence of a keystroke or a click of the touch pad 302. The controller 325 in an embodiment may also set the ways in which the piezo elements 320 in the piezo element layer beneath the cover sheet 305 deflect, in order to give the user a haptic experience similar to that of a conventional keyboard, or based on user input. For example, the controller 325 may cause the contact foil layer 310 affixed to each of the plurality of piezo elements 320 in the piezo element layer to apply specific voltages to the plurality of piezo elements 320, on an element-by-element basis. The changes in polarity and level of voltage applied to each piezo element 320 in the piezo element layer may dictate the variation in rigidity or movements of a given piezo element 320, the force with which it warps downward, then upward following deflection, and the sound such a return makes. The controller 325 may similarly apply voltage to each piezo element 320 in the piezo element layer via the contact foil layer 310 to make a single piezo element 320, a preset combination of piezo elements, or each of the piezo elements vibrate, click, bounce, or provide other haptic feedback pursuant to a haptic feedback control signal applied to the piezo element 320 upon detection of a keystroke.

By controlling the movement, rigidity, keystroke sensitivity, return force, vibration, pulsing, click, or other movement of piezo elements 320 in such a way, the controller 325 may control the force threshold required to cause a keystroke to register, the surface area on the cover sheet 305 in which a user may apply that force to cause a keystroke to register, and several aspects of the piezo element 320 haptic response following detection of such a keystroke. Each of these factors may be preset to a default position designed to mimic a conventional keyboard, in an embodiment, and adjusted by a user via a graphical user interface or may be set to provide a unique haptic response. In some embodiments, each of these factors may be set according to a personal typing profile associated with a current user, as accessed via memory of the information handling system or via a cloud-based memory storage. Further, changes made to any of these factors and applied by the controller 325 may be recorded for use in developing a personal typing profile for a given user.

Figure 4:
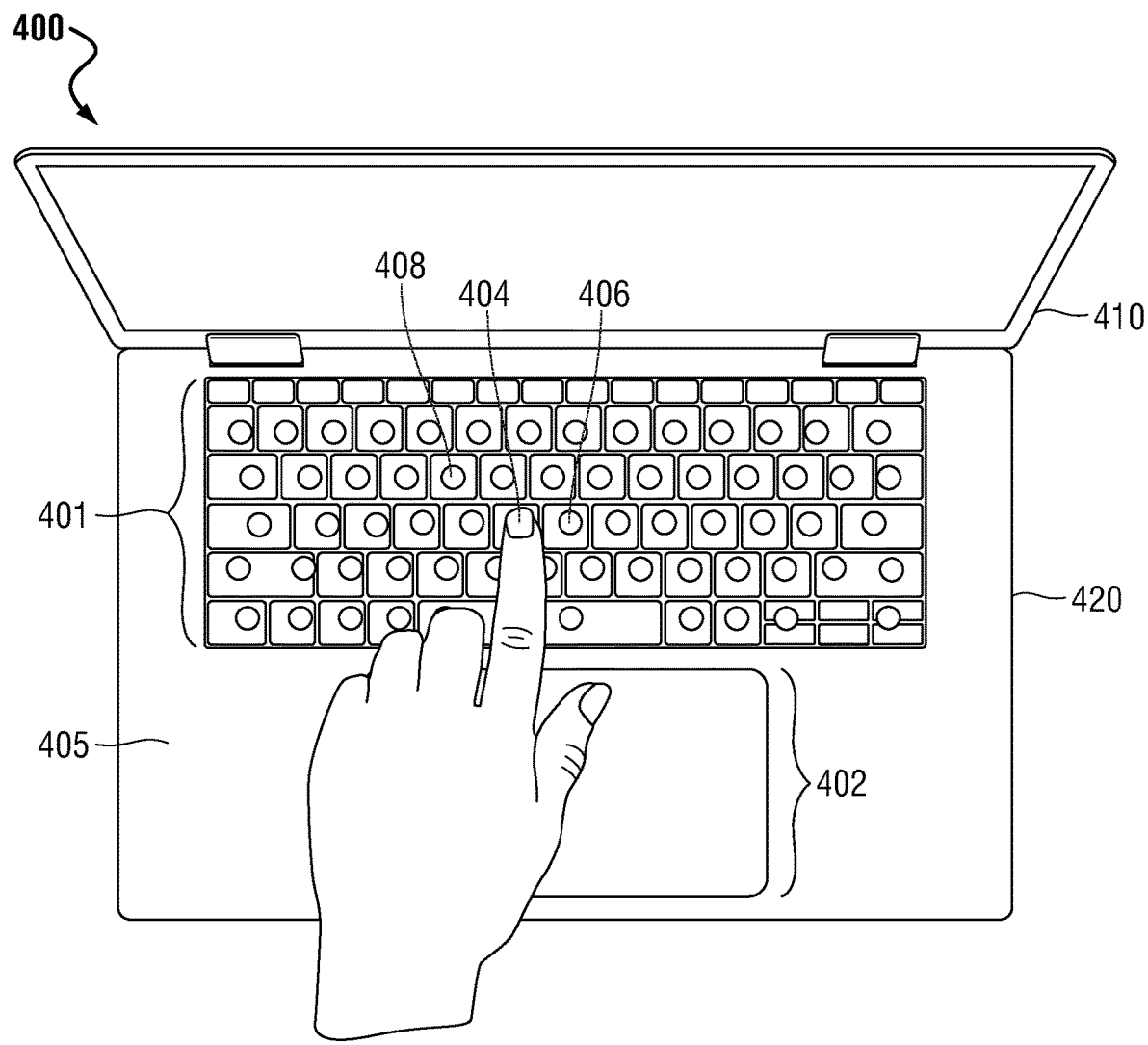
FIG. 4 is a graphical diagram illustrating deformation of a plurality of piezo elements pursuant to downward force applied by a user according to an embodiment of the present disclosure.

FIG. 4 is a graphical diagram illustrating deformation of a plurality of piezo elements situated within a set area of force detection pursuant to downward force applied by a user according to an embodiment of the present disclosure. FIG. 4 shows an information handling system 400 implementing a haptic keyboard area 401 and a haptic touchpad area 402 of a coversheet for a base chassis 420 of the information handling system according to embodiments herein. Information handling system 400 includes the base chassis 420 which may house the haptic keyboard 401 and the haptic touchpad 402 including the stack up layers of each as described in embodiments herein. Further, the C-cover of the base chassis 420 may include the coversheet 405 that operates to provide user interface locations for keys of haptic keyboard 401 and for a touchpad interface area for haptic touchpad 402. The base chassis 420 may further house components of the information handling system including processor, graphics processor, motherboard, graphics board, bus systems, power and battery systems, wireless systems, thermal controls, data and power ports, and other components in accordance with the description of FIG. 1. Those components may be installed according to techniques understood by those of skill. Further, base chassis 420 may be hinged to a display chassis for housing a display device and other components according to embodiments herein.

As described herein, a separate piezo element may be situated directly beneath each key cap within the cover sheet in some embodiments. In other embodiments, a plurality of piezo elements may be distributed horizontally across a layer disposed beneath the cover sheet, but the placement of each of the plurality of piezo elements may not directly correspond to the location of individual keys within the cover sheet. For example, in some embodiments, a single piezo element may be situated directly beneath a point 404 on the cover sheet at which the user applies a downward force. In one such embodiment, only a single piezo element (not shown) situated directly beneath the point 404 may deform, causing the controller to register a keystroke. In another such embodiment, the downward force applied at point 404 may cause some deflection of piezo elements 406 or 408, situated nearby the point 404, but not directly beneath it.

In other embodiments, the point 404 on the cover sheet at which the user applies downward force may not be situated directly above a single piezo element. In such an embodiment, the downward force applied at point 404 may cause full or partial deflection of one or more of the nearby piezo elements 406 or 408. Determination of the degree to which each of the piezo elements 406 and 408 deflect in such embodiments may be used to triangulate the center of the downward force applied at point 404. Because some of these piezo elements may be situated beneath the base chassis top cover, where a user may rest her palms while typing, the degree to which each of these piezo elements deflect may indicate placement of a user's palms upon the base chassis top cover at a given point in time in some embodiments.

Figure 5:
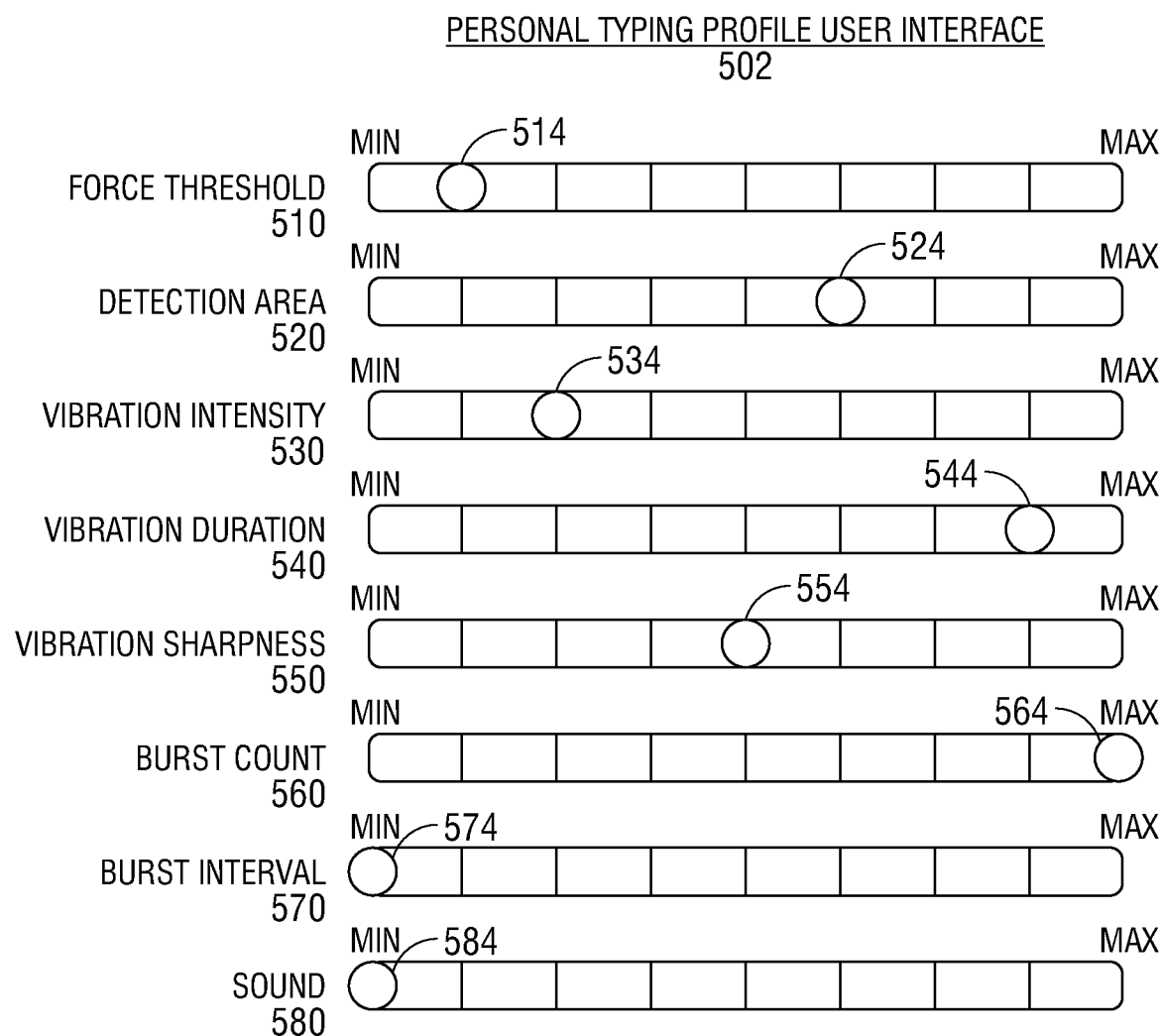
FIG. 5 is a graphical diagram illustrating a personal typing profile graphical user interface according to an embodiment of the present disclosure.

FIG. 5 is a graphical diagram illustrating a personal typing profile graphical user interface allowing a user to personalize several factors dictating haptic response of a piezo haptic keyboard assembly according to an embodiment of the present disclosure. As described herein, the tactile sensation of traditional mechanical keyboards is dictated mainly by the structural dynamics of the key cap, scissor mechanism, and rubber dome within the traditional keyboard assembly. In other words, these structures and the way in which they move when a user applies downward pressure dictate the user's tactile experience, including the force she must use to depress a key, the speed and force with which each of the keycaps returns to its neutral position after being depressed, and the sound such an interaction generates, among other aspects. By applying a preset haptic response control signal with varying magnitudes and polarities of voltage to each of the piezo elements in a piezo haptic keyboard assembly, a controller may control each of these factors influencing a user's tactile experience. In contrast to conventional keyboard assemblies, each of these factors may be adjusted, allowing for a wide range of tactile experiences for users. The personal typing profile user interface 502 in an embodiment may allow a user to set each of these factors according to their personal preferences. A controller operably connected to each of the piezo elements within a piezo haptic keyboard may receive instructions based on adjustable piezo element settings, and apply those settings to control the ways in which each of the piezo elements deflects in embodiments described herein.

Each of the factors dictating a user's haptic experience may be preset to a default position designed to mimic a conventional keyboard in an example embodiment, and adjusted by a user via the personal typing profile user interface 502 in an embodiment. Further, changes made to any of these factors and applied by the controller may be recorded for use in developing a personal typing profile for a given user. The personal typing profile user interface 502 in an embodiment may include a plurality of inputs or controls for adjusting, manipulating, and configuring one or more of these factors dictating a user's haptic experience. This can include receiving user commands from a mouse, keyboard, speech input, web site, remote web service, and/or other device such as a camera or video input to affect or modify operations of the personal typing profile user interface 502. For example, the personal typing profile user interface 502 in an embodiment may include a plurality of configurable icons, buttons, sliders, input boxes, selection options, menus, tabs and so forth having multiple configurable positions, shapes, text, data, and sounds to facilitate operations of the controller operably connected to the plurality of piezo elements of the piezo haptic keyboard assembly.

The factors dictating a user's haptic experience which may be manipulated via the user interface 502 in an embodiment may include, for example, the force threshold 510 required for the controller to register that a keystroke has occurred in some embodiments, and the size of the area 520 in which the user must apply such a force in order for the controller to register a keystroke due to sensitivity of the piezo element to application of force. In an example embodiment, the personal typing profile user interface 502 may allow the user to move the position of an indicator 514 along a slider to indicate a user-selected force threshold 510 for sensitivity (between a minimum and maximum allowable value) at which the controller may detect that a keystroke has occurred. Upon receipt of such a change in sensitivity, the typing profile personalization system in an embodiment may adjust a threshold voltage value, or a threshold change in voltage value that must be detected at one or more piezo elements in order to register a keystroke. For example, as described in an embodiment with reference to FIG. 2, upon deformation of the ceramic portion 222 of a piezo element 220, a voltage may be generated across the electrodes 235 and 240 operably connecting the piezo element 220 to the contact foil 210. Such voltage may be transmitted to the controller which may determine the magnitude of such voltage. Because the magnitude of such voltage may be correlated with the degree of deformation of the piezo element 220, the controller in such an embodiment may determine the depth of deformation of the piezo element 220 into the cavity 231, and thus, the force applied to the piezo element 220 to cause such deformation, based on the voltage received at the controller. A greater deformation upon actuation of a key location in an embodiment may cause the piezo element 220 to generate a greater magnitude of voltage.

The typing profile personalization system in an embodiment may increase or decrease the sensitivity, and thus, the force required to register a keystroke, for a given piezo element by increasing or decreasing the magnitude of voltage or change in voltage the controller must measure in order to register that a keystroke has occurred. For example, by increasing the magnitude of voltage or change in voltage the controller must measure in order to register that a keystroke has occurred, the typing profile personalization system in an embodiment may cause the controller to determine a keystroke has occurred when the piezo element deforms to a greater degree, requiring more downward force. As another example, by decreasing the magnitude of voltage or change in voltage the controller must measure in order to register that a keystroke has occurred, the typing profile personalization system in an embodiment may cause the controller to determine a keystroke has occurred when the piezo element deforms to a lesser degree, requiring less downward force.

In another embodiment, the personal typing profile user interface 502 may allow the user to move the position of an indicator 524 along a slider to indicate a user-selected detection area 520 surrounding the piezo element (between a minimum and maximum sensitivity allowable value) in which a user may apply downward pressure to cause the controller to detect that a keystroke has occurred. By setting the piezo element required force for actuation, such as decreasing the force required to deflect the piezo element, the controller may effectively make it easier for the user to deflect the piezo by applying downward pressure at a location farther away from the center of the piezo element, for example. Further, the controller for the piezoelectric element may detect actuation location on a key, such as actuation that is not in the center of a key versus center actuation in embodiments herein.

Other factors dictating a user's haptic experience that may be manipulated via the user interface 502 in an embodiment may include the intensity 530, duration 540, and sharpness 550 at which a piezo element vibrates or otherwise moves in response to a haptic electric haptic control feedback signal following registering of a keystroke, and the burst count 560 and interval 570 of sustained vibrations or other such movement occurring in response to use of specific applications. As described herein, in some embodiments, instead of returning immediately to the neutral position, the controller may apply an electrical response signal to a piezo element, causing it to move between its upward warped, downward warped, and neutral positions over a preset time period. For example, this electric haptic control feedback signal may have a certain voltage, current, and polarity (−,+) sufficient to render the piezoelectric material of the piezoelectric element 220 to cause a haptic event or sound. Such a response signal may be a sine wave, a square wave, a pulsed signal, or other waveform of changing current, voltage, or polarity applied to the piezoelectric element 220.

The personal typing profile user interface 502 may allow the user to set one or more of these factors controlling the characteristics of such haptic responses. For example, the user in an embodiment may move the position of an indicator 534 along a slider to indicate a user-selected vibration intensity 530 (between a minimum and maximum allowable value) or force at which a piezo element rotates between its upward or downward warped position, or neutral position during haptic response following a keystroke. As another example, the user in such an embodiment may move the position of an indicator 544 along a slider to indicate a user-selected vibration time duration 540. In still another example, the user in an embodiment may move the position of an indicator 554 along a slider to indicate a user-selected vibration sharpness 550 setting the duration of time between detection of the keystroke and deflection of the piezo element to its upward or downward warped positions or neutral position.

The controller in some embodiments may also cause a piezo element to vibrate for a prolonged period, or in a burst under certain conditions. Still other factors dictating a user's haptic experience that may be manipulated via the user interface 502 in an embodiment may include the burst count 560 and interval 570 of sustained vibrations or haptic response movements occurring in response to use of specific applications. The personal typing profile user interface 502 may allow the user to set one or more of these factors controlling the characteristics of such vibration bursts. For example, the user in an embodiment may move the position of an indicator 564 along a slider to indicate a user-selected burst count 560 or number of vibrations or other haptic response movements occurring during each such burst. As another example, the user in an embodiment may move the position of an indicator 574 along a slider to indicate a user-selected burst interval 570 or duration of such vibration bursts. The controller in such an embodiment may apply the user-selected burst count 560 and burst interval 570 by setting the number of voltage pulses, and the timing between them that the contact foil applies to the piezo element. In such a way, the user may set the haptic dynamics for a piezo haptic keyboard to her personal preferences using the personal typing profile user interface 502.

The controller in some embodiments may also cause a piezo element to vibrate or move to generate a sound under certain conditions. Such a factor dictating a user's haptic experience that may be manipulated via the user interface 502 in an embodiment and may include the sound setting 580 for sound occurring in response to use of specific applications when registering keystrokes. The personal typing profile user interface 502 may allow the user to set one or more sound levels controlling the characteristics of such auditory output in response to a keystroke. For example, the user in an embodiment may move the position of an indicator 584 along a slider to indicate a user-selected sound setting level 580 for how loud an auditory response may be. For example, a minimum setting may represent a silent mode for typing on the haptic keyboard. As another example, the user in an embodiment may move the position of an indicator 584 along a slider to indicate a sound level 580 provided in response to keystrikes during typing on the haptic keyboard. The controller in such an embodiment may apply the user-selected sound levels 580 that the contact foil applies to the piezo element. In such a way, the user may set the auditory haptic dynamics for a piezo haptic keyboard to her personal preferences using the personal typing profile user interface 502.

As described herein, a piezo controller applying voltages to a contact foil having a plurality of conductive traces electrically coupled to each of a plurality of piezo elements in an embodiment may control the several factors describing the dynamics of each piezo element, individually. In other words, the controller in an embodiment may apply different piezo haptic settings (e.g., force threshold 510, detection area 520, vibration intensity 530, vibration duration 540, vibration sharpness 550, burst count 560, or burst interval 570, or other aspects of a haptic response control signal) to different piezo elements, operating simultaneously. For example, piezo elements situated beneath two separate keys may be set to two different force thresholds 530, based on voltages set by the controller to detect deflection at each of those piezo elements. As another example embodiment, piezo elements situated beneath the touch pad may be set to a more sensitive detection area 520 than piezo elements situated beneath keys on the cover sheet. In still another example embodiment, piezo elements situated in one region of the touch pad may be set to a lesser vibration intensity 530 or other haptic response intensity than piezo elements situated beneath another region of the touch pad. For example, peripheral keys may have a greater haptic response intensity since contact with those keys by a user may be less robust.

Figure 6:
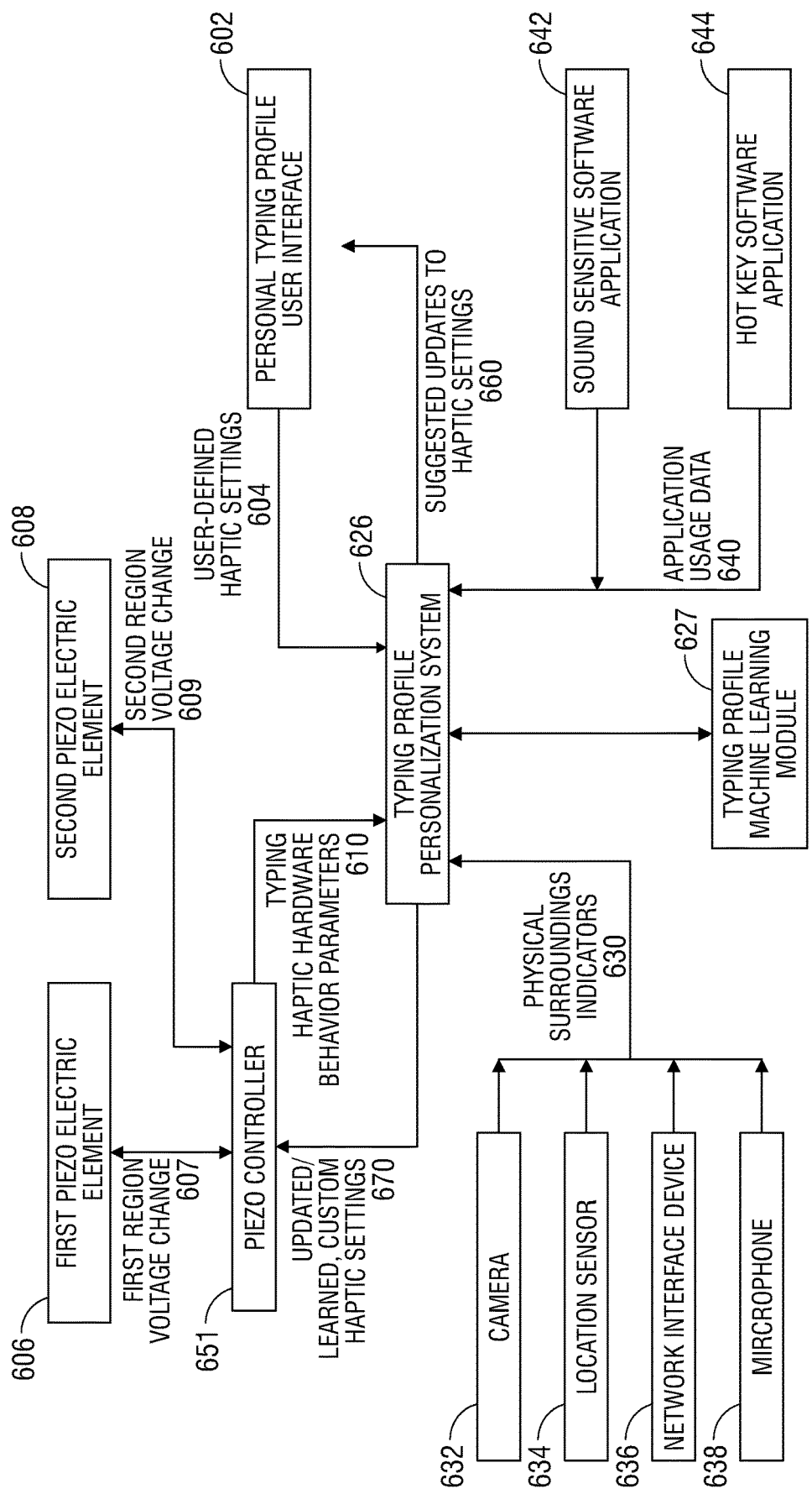
FIG. 6 is a block diagram illustrating a typing profile personalization system suggesting keyboard settings according to an embodiment of the present disclosure.

FIG. 6 is a block diagram illustrating a typing profile personalization system suggesting or automatically implementing keyboard settings corresponding to a personal typing profile according to an embodiment of the present disclosure. Such a personal typing profile in an embodiment may be made based on monitored user typing behavior, user-defined haptic settings, physical surroundings indicators, and application usage data, for example. The typing profile personalization system 626 in an embodiment may communicate with a piezo controller 651, the personal typing profile user interface 602, one or more software applications, and a plurality of environmental sensors to develop and apply a personal typing profile for a given user.

The piezo controller 651 in an embodiment may transmit haptics hardware typing behavior parameters 610 to the typing profile personalization system 626, including metrics describing how a user interacts with the keyboard and touchpad. Example haptics hardware typing behavior parameters 610 that may be gathered over time may include force of keystrikes as measured by magnitude of pressure recorded at each piezo electric element 606 and 608, intervals between keystrokes as recorded among piezo electric elements such as 606 and 608, duration of each keystrike of a key at a piezo element such as 606 and 608, and overall typing speed among all haptic keys across the haptic keyboard. These haptics hardware typing behavior parameters 610 may be recorded by the keyboard piezo controller 651 and reported to the typing profile personalization system.

As described herein, the controller 651 may be operably attached to a contact foil layer affixed to a plurality of piezo elements, such as 606 and 608. The plurality of piezo elements in an embodiment may deflect upon downward pressure applied by the user to the keyboard or the touch pad in an embodiment. For example, a first piezo electric element 606 may be situated beneath a first region of cover sheet, such as beneath a first key within the keyboard, and a second piezo electric element 608 may be situated beneath a second region of the cover sheet, such as beneath a second key within the keyboard. As a user applies a downward force in the first region (e.g., on the first key) in such an embodiment, the first piezo element 606 may deflect, applying an electrical current to the traces of the contact foil layer, and generate a voltage change 607 across the contact foil layer. The controller 651 may be operably connected to the contact foil layer and capable of associating the voltage change 607 with an indication that a keystroke above the first piezo electric element 606 has occurred. Similarly, as the user applies a downward force on the second region (e.g., on the second key) in such an embodiment, the second piezo element 608 may deflect, and generate a voltage change 609 across the contact foil layer, causing the controller to determine that a keystroke above the second piezo electric element 608 has occurred. This downward force may be recorded as a charge level indicating the force of keystrikes during typing on the first or second key in one example embodiment of haptics hardware typing behavior parameters 610. The keyboard controller may also determine the period of time when a keystrike occurs by timing the beginning and ending of the detected downward pressure on the key as recorded as a charge by the first or second piezo element 606 or 608. This duration of a keystrike is another example embodiment of haptics hardware typing behavior parameters 610. In another embodiment, an interval of time may be recorded between the end of a keystrike and the beginning of the next keystrike at the same piezo electric element for a haptic key as another one of the haptics hardware typing behavior parameters 610. In yet another embodiment, the duration from the beginning of keystrike as determined from a charge indicating pressure detected from one piezoelectric element to the beginning of another keystrike at the same or a different piezoelectric element may be recorded among a plurality of recorded keystrikes over a time period for detection of an overall typing speed. This overall typing speed may be recorded over any interval of time and is another embodiment of haptics hardware typing behavior parameters 610 returned to the typing profile personalization system 626.

In other embodiments, the first piezo element 606 or second piezo element 608 may each be situated partially beneath a plurality of keys on the keyboard, or partially or fully beneath the touch pad. In still other embodiments, one of the first piezo element 606 or the second piezo element 608 may be situated beneath the base chassis top cover where a user may rest her palms while typing. The voltage changes 607 and 609 in embodiments may further indicate the degree to which the piezo elements 606 and 608 deflected, indicating the force with which the user depressed the key or the touchpad situated atop the piezo elements 606 and 608, or the location of the user's palms on the base chassis top cover while typing. Further, by monitoring such voltage changes (e.g., 607 and 609) for each of the plurality of piezo elements within the piezo element layer in an embodiment, and aggregating such notifications over time, the piezo controller 651 may identify the locations of keystrokes and clicks for given keys or the touch pad (e.g., roughly within the center of the key or touch pad, or corner strikes), placement of a user's palms with respect to the keyboard, an average duration of keystrokes or touch pad clicks, force of keystrokes, pauses or intervals in typing, and an overall typing speed. Detection of downward pressure at multiple piezo elements may be used in some embodiments to triangulate a strike location. This may occur in embodiments where a plurality of piezo elements are situated beneath the touch pad, or where the piezo elements are not situated directly beneath a single key of the keyboard. For example, the piezo controller 651 in such an embodiment may compare voltage changes (each indicating a different degree of deflection) across two piezo elements situated nearby one another to determine the center of the keystroke, or the point at which the downward deflection of the coversheet is greatest. The piezo controller 651 or the typing profile personalization system 626 in an embodiment may also monitor, record, or recognize combinations in these parameters 610 that tend to coincide in occurrence. For example, the typing behavior parameters 610 in an embodiment may indicate a given user often presses the backspace key following a corner strike of a particular key or of multiple keys.

Changes in one or more of these haptics hardware typing behavior parameters 610 in an embodiment may indicate a change in users, a change in user mood, or a change in user-desired haptic response. For example, greater force in keystrokes or increased typing speed may indicate a higher level of stress, or may indicate the user would prefer a crisper, or louder haptic response. As another example, the typing profile personalization system in an embodiment may detect the user prefers to apply less force to the keys, and receive less intense haptic movement feedback following a keystroke when the user reviews and replies to e-mails from home in the evenings. In some example embodiments, users may prefer application of more intense haptic movement feedback with greater force application to the keys when first interfacing with the haptic keyboard of the present embodiments and then, over time, reducing the needed force application to the keys for actuation or reduce the level of intensity of the haptic movement feedback. As another example, the typing profile personalization system in embodiments may detect the user prefers to apply greater force, decrease the detection of corner strikes, and receive greater haptic response levels such as vibration amplitude for a longer duration when playing video games in an online gaming forum at night. As yet another example, the typing profile personalization system in an embodiment may determine the user wishes the piezo haptic keyboard assembly to be as silent as possible during typing when the user is actively using a video-conferencing application during working hours, or working at night in a darkened room. These metrics may then be transmitted to the typing profile personalization system 626 as typing behavior parameters 610 in an embodiment. These are only a few examples of behavior parameters that may be monitored and communicated to the typing profile personalization system 626 in an embodiment. Other embodiments contemplate any monitored metrics regarding keyboard or touchpad usage.

The typing profile personalization system 626 in an embodiment may also receive user-defined haptic settings 604 from the personal typing profile user interface 602. As described herein, by receiving voltage or applying a varying voltage of a haptic control feedback signal to each of the piezo elements in a piezo haptic keyboard assembly, a controller may control several factors influencing a user's tactile experience, including the force she must use to depress a key, the speed and force with which each of the keycaps provides a haptic control feedback signal and then returns to its neutral position after being depressed, and the sound such an interaction generates, among other aspects. A user may adjust each of these factors, for example, using the personal typing profile user interface 602 in an embodiment according to their personal preferences. An example personal typing profile user interface 602 is shown in FIG. 5. For example, a user may adjust the force threshold required for the controller to register that a keystroke has occurred, and the size of the area in which the user must apply such a force in order for the controller to register a keystroke, for example as a sensitivity level and with neighboring piezo elements detecting location of a keystroke on a key. As another example, a user may adjust the intensity, duration, or sharpness at which a piezo element vibrates or provides other haptic sensory feedback following registering a keystroke, and the burst count and interval of sustained vibrations occurring in response to use of specific applications. Finally, the user may adjust the sound response of the haptic keyboard from silent mode to a maximum level of auditory feedback with the haptic feedback response. As the user adjusts one or more of these settings in an embodiment, the personal typing profile user interface 602 may transmit these user-defined haptic settings 604 to the typing profile personalization system 626 to indicate a user's preferences at a given time. In an embodiment in which the user does not adjust any of these settings, the user-defined haptic settings 604 may be represented by a factory default value for each of these settings. These are only a few examples of user-defined haptic settings 604 that may be received by the typing profile personalization system 626 in an embodiment. Other embodiments contemplate any adjustable settings for a piezo haptic keyboard or touchpad assembly.

The typing profile personalization system 626 in an embodiment may also receive physical surroundings indicators 630 from one or more environmental sensors. For example, physical surroundings indicators 630 in an embodiment may include images, videos, or ambient light measurements captured by a camera 632. Images captured by the camera 632 in an embodiment may be used by the camera 632, an image processing application, or by the typing profile personalization system 626 for facial recognition, measurement of biometrics (e.g., infrared temperature measurement), or object recognition (e.g., detecting whether the user is in a crowded area). The physical surroundings indicators 630 in an embodiment may include such biometric measurements, object recognition determinations, or facial recognition determinations. Such camera-based physical surroundings indicators 630 in an embodiment may describe a user's ambient surroundings, such as whether the user is in a crowded or secluded environment, whether the user is working in a darkened room or outside during the day, or whether the user's biometric measurements indicate the user is stressed, fatigued, or relaxed, for example. Each of these factors may influence the way in which the user wishes to interact with the piezo haptic keyboard in an embodiment.

The physical surroundings indicators 630 in an embodiment may also include a determination of a current location of the information handling system. Such a location determination may take the form of Global Positioning Satellite (GPS) coordinates, other geographic locations (e.g., city, state, country), or known user-defined locations (e.g., work, home). Determination of the location may be made based on GPS triangulation, IP address of a connected network, or other geolocation methods known in the art. A user may adjust the settings of the piezo haptic keyboard in an embodiment based, at least in part, on the user's location. For example, a user may desire a more crisp, responsive feel in response to keystrokes while at work, and prefer a softer, quieter response while at home.

In an embodiment, the physical surroundings indicators 630 may also include identification of a connected network. For example, the network interface device 636 of the information handling system may transmit an identification of a wired or wireless network with which it has established a connection to the typing profile personalization system 626. Such information may be used to identify the location of the user, or to establish that the user is in transit. For example, if the network interface device 636 establishes a WLAN connection with a stationary access point over a long duration of time, it may be determined that the information handling system is roughly stationary. In contrast, if the network interface device 636 cannot establish a WLAN or WWAN signal, and either relies on a cellular signal to connect to the internet, or does not establish a connection with the internet at all, it may be determined the information handling system is travelling at a relatively high rate of speed (e.g., travelling via plane or car). Users may desire different piezo haptic keyboard settings during travel than while stationary in an embodiment. For example, a user may desire a quieter haptic response from the keyboard while travelling by plane alongside other passengers.

The physical surroundings indicators 630 in an embodiment may also include sound indicators captured by a microphone 638. A microphone 638 may capture ambient sound surrounding the information handling system, or may capture voice commands spoken aloud by a user in some embodiments. Ambient sound may indicate whether a user is in a relatively secluded space or in a crowded area surrounded by other people. Indicators 630 transmitted from the microphone 638 in an embodiment may also include indication that the user is engaged in an audio conversation with another person located within the same room, via a phone not included within the information handling system, or via a voice conferencing application running on the information handling system. Each of these indicators may influence the haptic response most preferred by a user at a given time. For example, a user may desire a louder haptic response in an embodiment when she is in a relatively noisy environment, and a quieter haptic response when she is in a relatively quiet environment (e.g., library). As another example, a user may desire a quieter haptic response when engaged in an audio conversation. Receipt of such physical surroundings indicators 630 by the typing profile personalization system 626 in an embodiment may allow the typing profile personalization system 626 to gauge the user's environmental surroundings at a given time, including a time when a user makes changes to the user-defined haptic settings 604. These are only a few examples of environmental condition indicators that may be monitored and communicated to the typing profile personalization system 626 in an embodiment. Other embodiments contemplate any information received from a sensor device, including Internet of Things (IoT) sensors, thermometers, biometric sensors (e.g., heart rate monitors, blood pressure monitors), or humidity sensors, for example. Data from other sensors is contemplated as well including imaging/camera sensors, proximity sensors, magnetometers, accelerometers, thermometers, battery management data, and the like that may be implemented as factors for determining the personal typing profile via the typing profile personalization system in yet other embodiments. For example, these sensors for environmental surroundings factors may provide an even more detailed set of factors for use with a machine learning or other algorithm of the typing profile personalization system to determine adjustments or suggestions to a personal typing profile for a user in other embodiments herein.

The typing profile personalization system 626 in an embodiment may also receive application usage data 640 from one or more applications running on the information handling system. For example, the information handling system in an embodiment may run a sound sensitive software application 642 or a hot key software application 644. A sound sensitive software application 642 may be one that operates best in quieter ambient surroundings, such as, for example, audio and video conferencing applications. A hot key software application 644 in an embodiment may include applications that employ one or more keys or the touch pad to perform an action within the application, other than typing of the letter represented by the key. For example, a computer game that uses the "F" key to fire a weapon may comprise such a hot key software application 644. Additionally, in some embodiments, the haptic touchpad interface area of the present disclosure may have secondary icons overlayed the touchpad interface surface for use as auxiliary keys for example. In some embodiments, the secondary icons may be marked on the haptic touchpad via markings or micro perforations in the coversheet of the haptic touchpad. Further, LED backlighting or light guide lighting may help illuminate these auxiliary keys of the haptic touchpad that may be enabled via physical buttons or as guided from software or data from sensors and may be enabled as part of personal typing profiles for a user. The piezoelectric elements of the touchpad may provide specified haptic effects for each auxiliary touchpad button or icon. For example, auxiliary touchpad buttons or keys may include keys for volume, do not disturb buttons, or a numeric keypad. These may be keyed to operating software applications and as part of the personal typing profile under some or all conditions outlined above. In other embodiments, application usage data 640 may include information managed by an application, such as, for example, a user's schedule indicating appointments, tasks, etc.

Preferred haptic response in an embodiment may vary based on whether one or more of these applications 642 or 644 are in active operation, or based on a user's schedule as retrieved from a schedule management application. A user may desire a quieter haptic response from the keyboard and touch pad when a sound sensitive software application 642 is actively running, for example. As another example, the user may prefer hot keys utilized by a hot key software application 644 (e.g., the "F" key for firing) to vibrate or provide some other haptic response or movement in bursts when playing a computer game. These are only a few examples of application data usage metrics that may be monitored and communicated to the typing profile personalization system 626 in an embodiment. Other embodiments contemplate any usage metrics routinely gathered for purposes of analytics, security assessment, or network/enterprise optimization, for example. For example, a proximity sensor may indicate a user near the information handling system and the personal typing profile may provide for turning off the keyboard after a period of time with no user sensed via proximity sensor or during an extended period of time in paused typing in other embodiments. In addition, the typing profile personalization system 626 may receive metrics for peripheral devices operably connected to the information handling system and in active use. For example, the application usage metrics may describe whether or how a user is engaging with an operably connected printer, mouse, removable hard drive, head mounted display, controller glove, or other gaming controller. Further, any of the behavioral parameters 610, user-defined haptic settings 604, physical surroundings indicators 630, or application usage data 640 may be recorded at a specific information handling system (e.g., the information handling system upon which code instructions of the typing profile personalization system 626 are currently being executed), across a plurality of information handling systems operated by the same user over time, or may be drawn from a plurality of information handling systems operated by a plurality of users in a crowd-sourced information gathering method.

Upon receiving the typing behavior parameters 610, the user-defined haptic settings 604, the physical surroundings indicators 630, and the application usage data 640 may use a typing profile machine learning module 627 to identify patterns correlating one or more of these factors with a user-preferred piezo haptic keyboard response profile. The typing profile personalization system in an embodiment may then identify a current user or user mood, or anticipate a needed change in haptic keyboard response settings based on detected patterns from the typing profile machine learning module 627. For example, a detected change in typing behavior parameters 610 in an embodiment may indicate a change in users, a change in user mood, or a change in user-desired haptic response. As another example, correlations made between user-defined haptic settings 604 and physical surroundings indicators 630 may indicate that a user desires a more crisp, responsive feel (e.g., longer vibrations at a greater intensity) in response to keystrokes while at work, when the user is showing signs of fatigue or stress, and prefer a softer (e.g., shorter vibrations at a lower intensity), quieter response while at home or when more relaxed. In an embodiment in which the typing behavior parameters 610 indicate a given user often presses the backspace key following a corner strike of a particular key or of multiple keys, in another example, this may indicate the user desires a less sensitive detection area for those keys, in order to decrease the rate of erroneous keystrokes recognized. In another example of correlations made between user-defined haptic settings 604 and physical surroundings indicators 630, the typing profile personalization system 626 may employ a machine learning method to determine that a user desires a louder haptic response in an embodiment when she is in a relatively noisy environment, and a quieter haptic response from the keyboard while travelling by plane alongside other passengers, when in a relatively quiet environment, or when engaged in an audio conversation. In yet another example, the typing profile personalization system may determine a correlation between user-defined haptic settings 604 and application usage data 640 indicating the user desires a quieter haptic response from the keyboard and touch pad when a sound sensitive software application 642 is actively running, or prefers hot keys utilized by a hot key software application 644 (e.g., the "F" key for firing) to vibrate in bursts when playing a computer game.

The typing profile personalization system in an embodiment may determine such correlations in an embodiment of the typing profile machine learning module 627, based on any machine learning or neural network methodology known in the art or developed in the future. For example, the typing profile personalization system in an embodiment may implement the typing profile machine learning module 627 to model the relationships between each of the typing behavior parameters 610, user-defined haptic settings 604, physical surroundings indicators 630, and application usage data 640 using a layered neural network topology. Such a neural network of the typing profile machine learning module 627 in an embodiment may include a plurality of layers, where each layer includes a plurality of nodes representing metric values or states for each of the parameters 610, settings 604, indicators 630, or usage data 640. An input layer to the neural network, for example, may include a known, recorded set of values for each of these parameters 610, settings 604, indicators 630, and usage data 640 metrics. An output layer to the neural network may include a projected optimal set of values for each of piezo haptic settings, based on the known, recorded set of values in the input layer.

The typing profile personalization system in an embodiment may attempt to determine the degree to which each of these parameters 610, settings 604, indicators 630, and usage data 640 metrics influence optimal piezo haptic settings by assigning preliminary weight matrices to each of the nodes in a given layer, where each assigned weight value in the matrix describes a correlation between at least one of these parameters 610, settings 604, indicators 630, and usage data 640 metrics and at least one of the piezo haptic settings. The neural network of the typing profile machine learning module 627 may be modeled using any number of layers, and the nodes in each additional layer may be determined based on the value of the nodes in the previous layer and the weight matrices describing correlations between each of the parameters 610, settings 604, indicators 630, and usage data 640 metrics and piezo haptic settings. In other words, each new layer in the neural network may include a plurality of nodes representing a best guess of how each of these parameters 610, settings 604, indicators 630, and usage data 640 metrics may affect optimal piezo haptic settings. A greater number of layers within the neural network topology may decrease the likelihood of divergence (yielding unusable results), but may increase processing time. The neural network of the typing profile machine learning module 627 may then produce an output layer including a plurality of nodes, each representing an expected or projected value for each of the learned, custom piezo haptic settings (e.g., force threshold, detection area, vibration intensity, vibration duration, vibration sharpness, burst count, burst interval). The process of generating an output layer, based on a known set of input layer values may be described herein as forward propagation. An initial forward propagation in an embodiment may project optimal learned, custom piezo haptic settings for a single, known set of values for each of these parameters 610, settings 604, indicators 630, and usage data 640 metrics.

The typing profile personalization system in an embodiment may compare the values in the output layer generated in such an initial forward propagation with known, recorded optimal piezo haptic settings chosen or accepted by a user at the time in which the values of the parameters 610, settings 604, indicators 630, and usage data 640 metrics given in the input layer of the neural network were recorded. In such a way, the typing profile personalization system may compare its projected optimal piezo haptic settings with actual, known optimal values, and determine a degree of error associated with each projected value (e.g., associated with each node in the output layer of the neural network). The typing profile personalization system may then use these known error margins to adjust the weight matrices associated with each layer of the modeled neural network. For example, the typing profile personalization system may perform a back-propagation method to adjust each of the weight matrices in order to more accurately reflect the correlations between each of these parameters 610, settings 604, indicators 630, and usage data 640 metrics and optimal piezo haptic settings.

The typing profile personalization system in an embodiment may perform this forward propagation and backward propagation, using different input node values repeatedly to finely tune the weight matrices of the typing profile machine learning module 627. For example, each time a user adjusts one of the piezo haptic settings, or the user accepts changes suggested by the typing profile personalization system based on detected changes to one or more of the parameters 610, settings 604, indicators 630, and usage data 640 metrics, the typing profile personalization system may forward propagate the parameters 610, settings 604, indicators 630, and usage data 640 metrics recorded at that time through the neural network. The typing profile personalization system may then compare the projected piezo haptic settings with the adjusted piezo haptic settings developed during that forward propagation, and back propagate through the layers of the neural network to adjust the correlated effects each of these parameters 610, settings 604, indicators 630, and usage data 640 metrics has on optimal piezo haptic settings. In such a way, the typing profile personalization system in an embodiment may adaptively learn how changes in these parameters 610, settings 604, indicators 630, and usage data 640 metrics may affect an individual user's choice of optimal piezo haptic settings.

The weight matrices associated with the layers of the neural network model from the typing profile machine learning module 627 in such an embodiment may describe, mathematically, these correlations for an individual user. The neural network model (including designation of the node values in the input layer, and number of layers), along with the weight matrices associated with each layer in an embodiment may form a personal typing profile for an individual user. Such a typing profile for an individual user may be stored to a memory for the information handling system or to a cloud-based memory device for access at a plurality of information handling systems in the future. By accessing personal typing profiles for an individual via cloud-based memory devices in an embodiment, the individual user may set a piezo haptic keyboard assembly at any information handling system to which the user is currently logged on to operate in accordance with learned, custom piezo haptic settings determined to be optimal based on current behavioral, environmental, and application usage data metrics observed at that information handling system. For example, the typing profile personalization system 626 may access a stored personal typing profile for a user who has just logged onto an information handling system, and forward propagate recently measured values for the parameters 610, indicators 630, or usage data 640 through the neural network using the weight matrices unique to that user's personal typing profile to determine optimal learned, custom piezo haptic keyboard settings for that user given currently measured input conditions.

Once the typing profile personalization system applies a machine learning methodology to determine such correlations in embodiments described herein, the typing profile personalization system may detect changes to any of these influencing factors and either suggest or automatically apply changes to one or more of the factors controlling the user's haptic experience of the piezo haptic keyboard assembly. For example, the typing profile personalization system 626 in an embodiment may continuously monitor incoming typing behavior parameters 610, physical surroundings indicators 630, and application usage data 640, and determine when one of these factors warrants a change to the user-defined haptic settings 604. For example, the typing profile personalization system 626 may input the newly recorded or altered typing behavior parameters 610, physical surroundings indicators 630, and application usage data 640 in the input layer of the neural network, and forward propagate to identify projected optimal piezo haptic settings in the output layer. In such a scenario, the typing profile personalization system 626 in some embodiments may transmit the projected optimal piezo haptic settings as a suggested learned, custom haptic settings update 660 to the personal typing profile user interface 602. The typing profile user interface 602 in such an embodiment may display the suggested changes, and allow the user to choose whether to apply such suggested changes or to decline such changes.

In an embodiment in which the user chooses to apply suggested changes, or in which the typing profile personalization system 626 automatically applies such changes without suggesting them to the user via the personal typing profile user interface 602, the typing profile personalization system 626 may transmit updated versions of learned, custom haptic settings 670 to the piezo controller 651. The updated versions of learned, custom haptic settings 670 may cause the controller 651 to apply a varying haptic feedback control voltage signal to the piezo element 606 or 608 via the contact foil layer, such that the piezo element deflects downward or upward or returns to a neutral position from a deflected position, depending on the haptic settings received at the controller 651 which may be learned, custom haptic settings 670 that were suggested or adopted from the typing profile machine learning module. In other embodiments the user may override the suggested or adopted machine learned typing profile settings and the typing profile personalization system 626 may pass through just user-defined haptic settings 604 as learned, custom haptic settings 670. The override by a user to reject or not incorporate the suggested learned optimal haptic settings determined by the typing profile personalization system 626 and the machine learning module 627 may be recorded and added to input factors in the machine learning process of the typing profile machine learning module 627.

With learned, custom haptic settings 670 as updated by acceptance or rejection of the suggested or adopted learned haptic settings, the controller 651 applying varying polarity and magnitude of voltages to the traces in the contact foil in an embodiment may control several factors describing the dynamics of the haptic keyboard assembly, in accordance with the received updated versions of learned, custom haptic settings 670 or any changes to the haptic settings defined by the user using a user interface 602. The haptic settings described below to via the learned, custom haptic settings 670 may contain learned haptic settings suggested via a typing profile machine learning module 627, user-defined haptic settings 604 defined via the personal typing profile user interface 602, or some combination of these in various embodiments and be delivered to the haptic keyboard controller 651 via the typing profile personalization system 626.

For example, by determining for the piezo element 606 or the piezo element 608 a modified force level required for a user applying downward force in an embodiment, based on the received updated versions of learned, custom haptic settings 670, the controller 651 may set the downward force required to register a keystroke or a click of the touch pad, as well as roughly define the area (e.g., in the center of the key or touch pad, or on the edges of the key or touch pad) in which a user must apply that force. As another example, the controller 651 may set the intensity or force with which a key provides haptic feedback following a keystroke, based on the received updated versions of learned, custom haptic settings 670. For example, the controller 651 may set the cycle of movement, pulsing, and intensity of the piezo element 606 movement by adjusting the amplitude, polarity, pulsing, or waveform of the haptic control feedback signal provided to the piezo electric element 606. The controller 651 in another example may set the duration and sharpness of such a haptic response, based on the received updated versions of learned, custom haptic settings 670, by setting the duration of time between detection of the keystroke and deflection of the piezo element 606 to its neutral position, or to a position in which it deflects upward and away from the base support plate. In still another example, the controller 651 may set hot buttons or controller keys to control the duration of hot key vibration bursts, and the interval between the haptic response movements in such bursts, based on the received updated versions of learned, custom haptic settings 670, by setting the number of voltage pulses, and the timing between them that the contact foil applies to the piezo element 606 or the piezo element 608. By monitoring typing behavior parameters 610, user-defined haptic settings 604, physical surroundings indicators 630, and application usage data 640, suggesting changes based on such correlations, and continuing to receive user feedback (e.g., accepting or receiving suggested changes), the typing profile personalization system in embodiments described herein may develop a personalized typing profile for individual users and cause a controller for any piezo haptic keyboard assembly to operate according to that user's personalized typing profile.

Once a personal typing profile has been determined by typing profile personalization system 626 from haptics hardware typing behavior parameters 610 and user-defined haptic settings 604 which may be processed by the typing profile machine learning module, the haptic feedback feel of the haptic keyboard may be established for a personal profile for the user. This personal profile may adjust the haptic feel of the haptic keyboard depending on factors such as applications operating, time or day, location, or other external factors detected as physical surroundings indicators 630 or application usage data 640. This haptic feedback feel personal profile may provide these feel settings in the learned, custom haptic settings 670 to control the response of the piezo electric elements 606 and 608 via the keyboard piezo controller 651. In an embodiment of the present disclosure, the personal typing profile determined for a user may be shared or recreated across multiple devices implementing the haptic keyboard of the present embodiments. In this way, when a user switches devices, the haptic feedback feel may be transferred so that the typing experience may be the same or similar across multiple devices implementing haptic keyboards.

Figure 7:
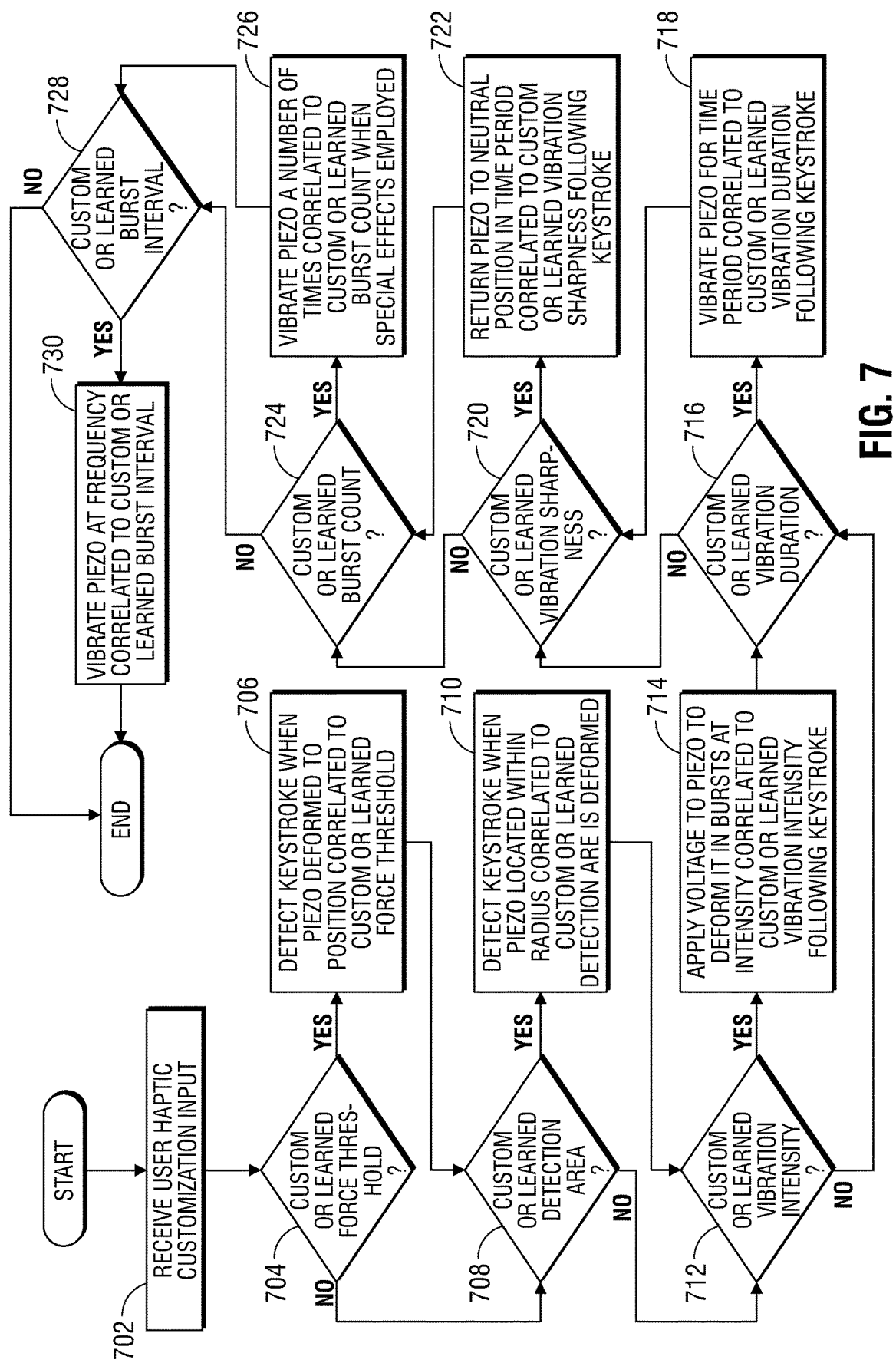
FIG. 7 is a flow diagram illustrating a method of implementing keyboard settings for a piezo electric haptic keyboard assembly according to an embodiment of the present disclosure.

FIG. 7 is a flow diagram illustrating a method of implementing keyboard settings for a piezo electric haptic keyboard assembly corresponding to a personal typing profile according to an embodiment of the present disclosure. As described herein, upon receiving user-defined haptic settings or determining a personal typing profile for a given user in an embodiment, the typing profile personalization system may apply instructions to a controller for a plurality of piezo elements to apply such user-defined or learned haptic settings.

At block 702, a typing profile personalization system in an embodiment may receive user-customized haptic settings, or learned haptic settings. For example, in an embodiment described with reference to FIG. 5, the personal typing profile user interface 502 in an embodiment may allow a user to set each of several factors governing the haptic response according to their personal preferences. Each of the factors dictating a user's haptic experience may be preset to a default position designed to mimic a conventional keyboard, and adjusted by a user via the personal typing profile user interface 502 in an embodiment. For example, the user may adjust the force threshold 510, detection area 520, vibration intensity 530, vibration duration 540, vibration sharpness 550, burst count 560, or burst interval 570 in an embodiment. Each of these settings in an embodiment may comprise a custom haptic setting with reference to FIG. 7.

As another example, in an embodiment described with reference to FIG. 6, the typing profile personalization system 626 may receive user-defined haptic settings 604 from the personal typing profile user interface 602. As the user adjusts one or more of these factors in an embodiment, the personal typing profile user interface 602 may transmit these user-defined haptic settings 604 to the typing profile personalization system 626 to indicate a user's preferences at a given time. In an embodiment in which the user does not adjust any of these factors, the user-defined haptic settings 604 may be represented by a factory default setting for each of these factors.

In aspect of an embodiment, one or more of these factors may be updated by the typing profile personalization system itself based on machine learning analysis of a combination of current typing behavior parameters, user-defined haptic settings, application usage data, and environmental condition indicators. For example, the typing profile personalization system 626 in an embodiment may continuously monitor incoming typing behavior parameters 610, user-defined haptic settings 604, physical surroundings indicators 630, and application usage data 640, and determine when one of these factors warrants a change to the user-defined haptic settings 604. In such an embodiment, the typing profile personalization system may receive such learned haptic settings 604, and each of these settings in an embodiment may comprise a learned haptic setting with reference to FIG. 7.

The typing profile personalization system in an embodiment may determine at block 704 whether the learned, custom haptic setting involves a change to the force threshold. For example, in an embodiment described with reference to FIG. 5, the typing profile personalization system may determine whether the user has adjusted the force threshold 510 using the personal typing profile user interface 502. In an embodiment described with reference to FIG. 6, the typing profile personalization system 626 may determine whether a change suggested based on machine learning analysis of parameters 610, settings 604, usage data 640, or indicators 630, or the user-defined haptic settings 604 involve a change to the force threshold. For example, the typing profile personalization system in an embodiment may detect the user prefers to apply less force to the keys when the user reviews and replies to e-mails from home in the evenings. As another example, the typing profile personalization system in an embodiment may detect the user prefers to apply greater force when playing video games in an online gaming forum at night. As yet another example, the typing profile personalization system in an embodiment may determine the user wishes the piezo haptic keyboard assembly to be as silent as possible during typing when the user is actively using a video-conferencing application during working hours. If the learned, custom haptic setting involves a change to the force threshold, the method may proceed to 706. If the learned, custom haptic setting does not involve a change to the force threshold, the method may proceed to block 708 to determine if the learned, custom haptic setting involves changes to another setting governing haptic response.

At block 706, the typing profile personalization system in an embodiment in which the learned, custom haptic setting involves a change to the force threshold may detect a keystroke when one or more piezo elements is deformed to a position correlated to the learned, custom force threshold. Upon receipt of a learned, custom haptic setting adjusting the force threshold required to detect a keystroke, the typing profile personalization system in an embodiment may adjust a threshold voltage value, or a threshold change in voltage value that must be detected at one or more piezo elements in order to register a keystroke. As described in an embodiment with reference to FIG. 2, upon deformation of the ceramic portion 222 of a piezo element 220, a voltage or change in voltage may be generated across the electrodes 235 and 240 operably connecting the piezo element 220 to the contact foil 210. Such voltage or change in voltage may be transmitted to the controller which may determine the magnitude of such voltage or change in voltage. Because the magnitude of such voltage or change in voltage may be correlated with the degree of deformation of the piezo element 220, the controller in such an embodiment may determine the depth of deformation of the piezo element 220 into the cavity 231, and thus, the force applied to the piezo element 220 to cause such deformation, based on the voltage or change in voltage received at the controller. A greater deformation in an embodiment may cause the piezo element 220 to generate a greater magnitude of voltage or change in voltage.

The typing profile personalization system in an embodiment may increase or decrease the sensitivity, and thus, the force required to register a keystroke, for a given piezo element by increasing or decreasing the magnitude of voltage the controller must measure in order to register that a keystroke has occurred. For example, by increasing the magnitude of voltage the controller must measure in order to register that a keystroke has occurred, the typing profile personalization system in an embodiment may cause the controller to determine a keystroke has occurred when the piezo element deforms to a greater degree, requiring more downward force. As another example, by decreasing the magnitude of voltage the controller must measure in order to register that a keystroke has occurred, the typing profile personalization system in an embodiment may cause the controller to determine a keystroke has occurred when the piezo element deforms to a lesser degree, requiring less downward force.

In another embodiment, the force threshold required to register a keystroke may be adjusted by adjusting the neutral position of a piezo element. For example, in an embodiment described with reference to FIG. 2, a controller operably attached to the contact foil 210 in an embodiment may adjust the downward force 202 required to register a keystroke by increasing the voltage or change in voltage the controller must receive in order to detect occurrence of a keystroke. This may, in turn require a greater deflection of the piezo element 220 in order to generate such a voltage or change in voltage.

The typing profile personalization system in an embodiment may determine at block 708 whether the learned, custom haptic setting involves a change to the keystroke or touch pad click detection area. For example, in an embodiment described with reference to FIG. 5, the typing profile personalization system may determine whether the user has adjusted the detection area 520 using the personal typing profile user interface 502. In an embodiment described with reference to FIG. 6, the typing profile personalization system 626 may determine whether a change suggested based on machine learning analysis of parameters 610, settings 604, usage data 640, or indicators 630, or the user-defined haptic settings 604 involve a change to the detection area. For example, the typing profile personalization system in an embodiment may prefer to decrease the detection of corner strikes when playing video games in an online gaming forum at night or for a fast typist. As another example, the typing profile personalization system in an embodiment may detect the user repeatedly hits the backspace button after a corner strike is detected at a given piezo electric element, and infer the user wishes to decrease the ability of that piezo electric element to detect corner strikes. Detection area may be assessed via activation of neighbor piezo elements to one associated with a key during a keystroke. If the neighbor piezo element is also activated fully, the typing profile personalization system may associate the partial activation of the piezo element that is deformed to a lesser degree as an errant keystroke. If the learned, custom haptic setting involves a change to the detection area, the method may proceed to 710. If the learned, custom haptic setting does not involve a change to the detection area, the method may proceed to block 712 to determine if the learned, custom haptic setting involves changes to another setting governing haptic response.

At block 710, the typing profile personalization system in an embodiment in which the learned, custom haptic setting involves a change to the keystroke or touch pad click detection area of a keyboard key that may detect a keystroke or click of the touch pad when the piezo located within the radius correlated to the user customized detection area is at a preset threshold value modifying sensitivity. As described herein, a separate piezo element may be situated directly beneath each key cap within the cover sheet in some embodiments. For example, in such an embodiment described with respect to FIG. 2, a corner strike 204 may be less likely to cause optimal deflection of the piezo element 220, in comparison to application of downward pressure 202 directly in the middle of the piezo element 220. Because such a corner strike 204 may cause the piezo element 220 to deflect less than a pointed, center key strike would, a user performing a corner strike 204 in an embodiment may need to provide greater downward force in the corner strike 204 to cause the controller to register a keystroke has occurred. For example, a neighbor piezo element (not shown), situated directly adjacent the piezo element 220 may be fully deformed, while the piezo element 220 is only partially deformed. In such an embodiment, the typing profile personalization system may associate the partial deformation of the neighbor piezo element as an errant keystroke for that neighbor piezo element, but may register the greater deformation of the piezo element 220 as an intentional keystroke for the key cap situated atop the piezo element 220. Thus, the controller can decrease the likelihood that such a corner strike 204 will sufficiently deflect the piezo element 220 to indicate a keystroke has occurred by increasing the force threshold required for the controller to register a keystroke has occurred. In other words, the controller may make the piezo element 220 less sensitive to a corner strike 204 by increasing the force threshold, or decreasing activity of neighboring piezo elements associated with nearby keys of the haptic keyboard.

In other embodiments, a plurality of piezo elements may be distributed horizontally across a layer disposed beneath the cover sheet, but the placement of each of the plurality of piezo elements may not directly correspond to the location of individual keys within the cover sheet. For example, in an embodiment described with reference to FIG. 4, the point 404 on the cover sheet at which the user applies downward force may not be situated directly above a single piezo element. In such an embodiment, the downward force applied at point 404 may cause full or partial deflection of one or more of the nearby piezo elements 406 or 408. Determination of the degree to which each of the piezo elements 406 and 408 neighboring the location of the keystroke or downward force deflect in such embodiments may be used to triangulate the center of the downward force applied at point 404. The controller in an such an embodiment may cross-reference this triangulated position with the known position of specific keys or the touch pad surface dimensions as stored in a memory to determine whether the detected force is being applied in the center of a key or the touch pad or whether the force is being applied in the corner of a key or the touch pad. Such corner key or corner touch pad keystrokes in an embodiment may indicate erroneous or unintentional contacts. The controller in such an embodiment may be set to recognize occurrence of a keystroke only when the triangulated position of downward force is within a learned or custom radius of the known positions of a given key or position on the touch pad surface.

The typing profile personalization system in an embodiment may determine at block 712 whether the learned, custom haptic setting involves a change to the vibration intensity as part of a haptic response to a keystroke or other applied actuation. For example, in an embodiment described with reference to FIG. 5, the typing profile personalization system may determine whether the user has adjusted the vibration intensity 530 using the personal typing profile user interface 502. As another example, in an embodiment described with reference to FIG. 6, the typing profile personalization system 626 may determine whether a change suggested based on machine learning analysis of parameters 610, settings 604, usage data 640, or indicators 630, or the user-defined haptic settings 604 suggest or cause a change to the vibration intensity. For example, the typing profile personalization system in an embodiment may detect the user prefers to receive lower vibrations following a keystroke when the user reviews and replies to e-mails from home in the evenings. As another example, the typing profile personalization system in an embodiment may detect the user prefers to receive greater vibrations for a longer duration when playing video games in an online gaming forum at night, or when the user is displaying signs of tiredness. As yet another example, the typing profile personalization system in an embodiment may determine the user wishes the piezo haptic keyboard assembly to be as silent as possible during typing when the user is actively using a video-conferencing application during working hours. If the learned, custom haptic setting involves a change to the vibration intensity, the method may proceed to 714. If the learned, custom haptic setting does not involve a change to the vibration intensity, the method may proceed to block 716 to determine if the learned, custom haptic setting involves changes to another setting governing haptic response.

At block 714, the typing profile personalization system in an embodiment in which the learned, custom haptic setting involves a change to the vibration intensity may apply the change to the haptic control feedback signal to vary a voltage to one or more piezo elements to deform them in bursts at an intensity correlated to the learned, custom vibration intensity. For example, the set vibration intensity may be part of a haptic response following a keystroke or a click of the touch pad. As described in an embodiment with respect to FIG. 2, at a preset time following detection of a keystroke in an embodiment, the controller may supply a haptic control voltage signal to the piezo element 220, via contact foil 210, causing it to warp upward or downward providing tactile haptic feedback to the user.

In some embodiments, the controller may apply a series of voltage pulses at varying magnitude or polarity to the piezo electric element 220, via the contact foil 210, causing the piezo element 220 to vibrate, pulse, or rotate between upward warped and downward warped positions over a preset time period. The controller in an embodiment may set the intensity or force with which a key moves between its upward warped and downward warped positions following a keystroke. For example, as the learned, custom vibration intensity increases, the controller may cause the piezo element 220 to warp upward or warp downward to a greater degree during such a haptic movement feedback in an embodiment. As another example, as the learned, custom vibration intensity decreases, the controller may cause the piezo element 220 to warp upward or warp downward to a lesser degree during such a haptic movement feedback in an embodiment. The controller in such embodiments may affect the degree of deflection by applying varying voltage levels to the piezo element 220 at either or both polarities via the contact foil layer 210.

The typing profile personalization system in an embodiment may determine at block 716 whether the learned, custom haptic setting involves a change to the haptic movement or vibration duration. For example, in an embodiment described with reference to FIG. 5, the typing profile personalization system may determine whether the user has adjusted the vibration duration 540 or a portion of haptic feedback movement using the personal typing profile user interface 502. As another example, in an embodiment described with reference to FIG. 6, the typing profile personalization system 626 may determine whether a change suggested based on machine learning analysis of parameters 610, settings 604, usage data 640, or indicators 630, or the user-defined haptic settings 604 involve a change to the movement or vibration duration. For example, the typing profile personalization system in an embodiment may detect the user prefers to receive longer vibrations following a keystroke when the user is exhibiting signs of tiredness. As another example, the typing profile personalization system in an embodiment may detect the user prefers to receive greater movement or vibrations for a longer duration when playing video games in an online gaming forum at night. As yet another example, the typing profile personalization system in an embodiment may detect the user prefers to receive lesser movement or vibrations for a shorter duration when typing at higher speeds. If the learned, custom haptic setting involves a change to the haptic movement or vibration duration, the method may proceed to 718. If the learned, custom haptic setting does not involve a change to the haptic movement or vibration duration, the method may proceed to block 720 to determine if the learned, custom haptic setting involves changes to another setting governing haptic response.

At block 718, the typing profile personalization system in an embodiment in which the learned, custom haptic setting involves a change to the haptic movement or vibration duration may apply a haptic voltage signal to one or more piezo elements for the time period correlated to the learned, custom vibration duration following a keystroke or a click of the touch pad or key. For example, the controller in an embodiment described with respect to FIG. 2 may set the duration of such a vibration or other haptic movement by setting the duration of time during which it applies an electric haptic control feedback signal of varying voltage magnitudes or polarities to the traces on the contact foil 210 operably connected to the piezo element 220. The duration of such a signal may dictate the length of movement of the haptic feedback response (e.g. time period during which the piezo element 220 moves between its upward warped and downward warped positions).

The typing profile personalization system in an embodiment may determine at block 720 whether the learned, custom haptic setting involves a change to the movement or vibration sharpness of the haptic feedback. For example, in an embodiment described with reference to FIG. 5, the typing profile personalization system may determine whether the user has adjusted the vibration sharpness 550 using the personal typing profile user interface 502. As another example, in an embodiment described with reference to FIG. 6, the typing profile personalization system 626 may determine whether a change suggested based on machine learning analysis of parameters 610, settings 604, usage data 640, or indicators 630, or the user-defined haptic settings 604 involve a change to the vibration sharpness. Haptic movement or vibration sharpness may dictate the time that elapses between detection of a keystroke and initiation of the haptic movement or vibration of the piezo element in response, in an example embodiment. For example, the typing profile personalization system in an embodiment may detect the user prefers increased haptic movement or vibration sharpness when the user is displaying signs of tiredness or high stress. If the learned, custom haptic setting involves a change to the haptic movement or vibration sharpness, the method may proceed to 722. If the learned, custom haptic setting does not involve a change to the haptic movement or vibration sharpness, the method may proceed to block 724 to determine if the learned, custom haptic setting involves changes to another setting governing haptic response.

At block 722, the typing profile personalization system in an embodiment in which the learned, custom haptic setting involves a change to the haptic movement or vibration sharpness may transmit a haptic voltage signal after a time correlated to the learned, custom vibration sharpness passes, following activation of a piezo element. Haptic movement or vibration sharpness in an embodiment may refer to the amount of time that is allowed to pass between detection of a keystroke and initiation of a haptic response. For example, the controller in an embodiment described with respect to FIG. 2 may receive a voltage generated at the solder points 235 and 240 via the contact foil 210 when the piezo element 220 warps downward under user-applied force, and may respond by transmitting a haptic voltage signal causing the piezo element 220 to warp upward, or to move between upward and downward warped positions. The controller in such an embodiment may affect the sharpness of such a haptic movement or a vibration by allowing a shorter or longer time period to elapse between receipt of the voltage indicating the piezo element 220 has been deformed downward under user-applied pressure, and transmission of the responsive haptic voltage signal causing the haptic movement (e.g. upward or downward warping) of the piezo element 220. A greater sharpness in an embodiment may be associated with a shorter time period elapsing between receipt of voltage indicating activation of the piezo element and transmission of the responsive haptic voltage signal. A lesser sharpness in an embodiment may be associated with a greater time period elapsing between these two actions.

The typing profile personalization system in an embodiment may determine at block 724 whether the learned, custom haptic setting involves a change to the burst count for a burst component of a haptic feedback. For example, in an embodiment described with reference to FIG. 5, the typing profile personalization system may determine whether the user has adjusted the burst count 560 using the personal typing profile user interface 502. As another example, in an embodiment described with reference to FIG. 6, the typing profile personalization system 626 may determine whether a change suggested based on machine learning analysis of parameters 610, settings 604, usage data 640, or indicators 630, or the user-defined haptic settings 604 involve a change to the burst count. For example, the typing profile personalization system in an embodiment may detect the user prefers a greater burst count when the user is utilizing special effects such as in a gaming system or with applications where distinct haptic feedback is beneficial, or a lower burst count when the user is working quickly, such as when typing at high speed. If the learned, custom haptic setting involves a change to the burst count, the method may proceed to 726. If the learned, custom haptic setting does not involve a change to the burst count, the method may proceed to block 728 to determine if the learned, custom haptic setting involves changes to another setting governing haptic response.

At block 726, the typing profile personalization system in an embodiment in which the learned, custom haptic setting involves a change to the burst count may repeatedly warp (e.g., upwards or downwards) one or more piezo elements a number of times correlated to the learned, custom burst count. As described herein, the controller in some embodiments may cause a piezo element to provide haptic movement or vibrate for a prolonged period, in a burst, under certain conditions. For example, certain keys may be used as hot keys or controller keys for certain applications in an embodiment. A user playing a video game may use the "F" key to fire a weapon, for example. In some embodiments, the controller may set these hot buttons or controller keys to deliver such a prolonged burst of haptic movement in response to certain instructions received from the corresponding application (e.g., computer game). For example, the "F" key used to fire a weapon in an embodiment may deliver a burst of haptic movements (e.g., warping upward or warping downward) when the weapon the user is attempting to fire is out of ammunition. In another example embodiment, the piezo element situated beneath the touchpad may deliver a burst of haptic movement to indicate the player has been injured. The controller in such embodiments may control the duration of such haptic movement bursts by setting the number of voltage pulses causing polarity changes and movement of the piezo element. For example, in an embodiment described with reference to FIG. 2, the controller may cause the contact foil layer 210 to apply voltage changes in polarity of a haptic feedback control signal to the piezo element 220 causing it to move between an upward warped position, downward warped position, or neutral position. For example, a square wave, sine wave, or other electric haptic control feedback signal may be employed. The controller may increase the number of cycles of such a haptic movement burst in response to an increase in the learned, custom burst count in an embodiment. In contrast, the controller may decrease the number of cycles of such a vibration burst in response to a decrease in the learned, custom burst count in an embodiment. In other words, while movement vibration intensity, duration, and sharpness may affect the amplitude, period, and transition over one or more cycles, the burst count may increase or decrease the number of cycles of a haptic feedback response.

The typing profile personalization system in an embodiment may determine at block 728 whether the learned, custom haptic setting involves a change to the burst interval. For example, in an embodiment described with reference to FIG. 5, the typing profile personalization system may determine whether the user has adjusted the burst interval 570 using the personal typing profile user interface 502. As another example, in an embodiment described with reference to FIG. 6, the typing profile personalization system 626 may determine whether a change suggested based on machine learning analysis of parameters 610, settings 604, usage data 640, or indicators 630, or the user-defined haptic settings 604 involve a change to the burst interval. For example, the typing profile personalization system in an embodiment may detect the user prefers a greater burst interval for a longer burst cycle when the user is displaying signs of tiredness or casually typing or utilizing the keyboard, or a slower burst interval for a shorter burst cycle when the user is displaying signs of high stress, or typing at speed. If the learned, custom haptic setting involves a change to the burst interval, the method may proceed to 730. If the learned, custom haptic setting does not involve a change to the burst interval, no further adjustments to the piezo haptic keyboard settings may be needed and the method may end.

At block 730, the typing profile personalization system in an embodiment in which the learned, custom haptic setting involves a change to the burst interval may cause one or more piezo elements to move from an upward warped to a downward warped position repeatedly, at a frequency correlated to the learned, custom burst interval. In another embodiment, the one or more piezo elements may move from an upward warped position to a neutral position, or from a downward warped position to a neutral position at such a frequency. In yet another embodiment, the one or more piezo elements may warp downward to mimic a mechanical key falling travel and then warp upward to mimic a mechanical key rebound before returning to a neutral position thus mimicking a mechanical key haptic feedback event. Such a move may have a cycle and each phase may have an interval, transition speed, sharpness, intensity, and amplitude which may affect the nature of the haptic feedback feel mimicking the mechanical key actuation. The controller in an embodiment may control the interval between such cyclical movements in such bursts by setting the timing between cycles of movements. In some embodiments, a vibration burst may include a series of separate movement cycles, with each vibration period including multiple cycles and may include pauses between burst cycles. In such an embodiment, each burst period may be separated from another by an intervening time period in which the piezo element does not move, resulting in burst pulsing. The controller in such an embodiment may control the burst interval in such an embodiment and increase or decrease the duration of this intervening time period. In other words, while vibration intensity, duration, and sharpness may affect the amplitude, period, and transition over one or more cycles, the burst count may increase or decrease the amount of time for each burst cycle or the time passing in between repetitions of these cycles. The method may then end. In such a way, a controller for any piezo haptic keyboard assembly may cause each of a plurality of piezo elements within a piezo haptic keyboard assembly to operate according to that user's personalized typing profile.

Figure 8:
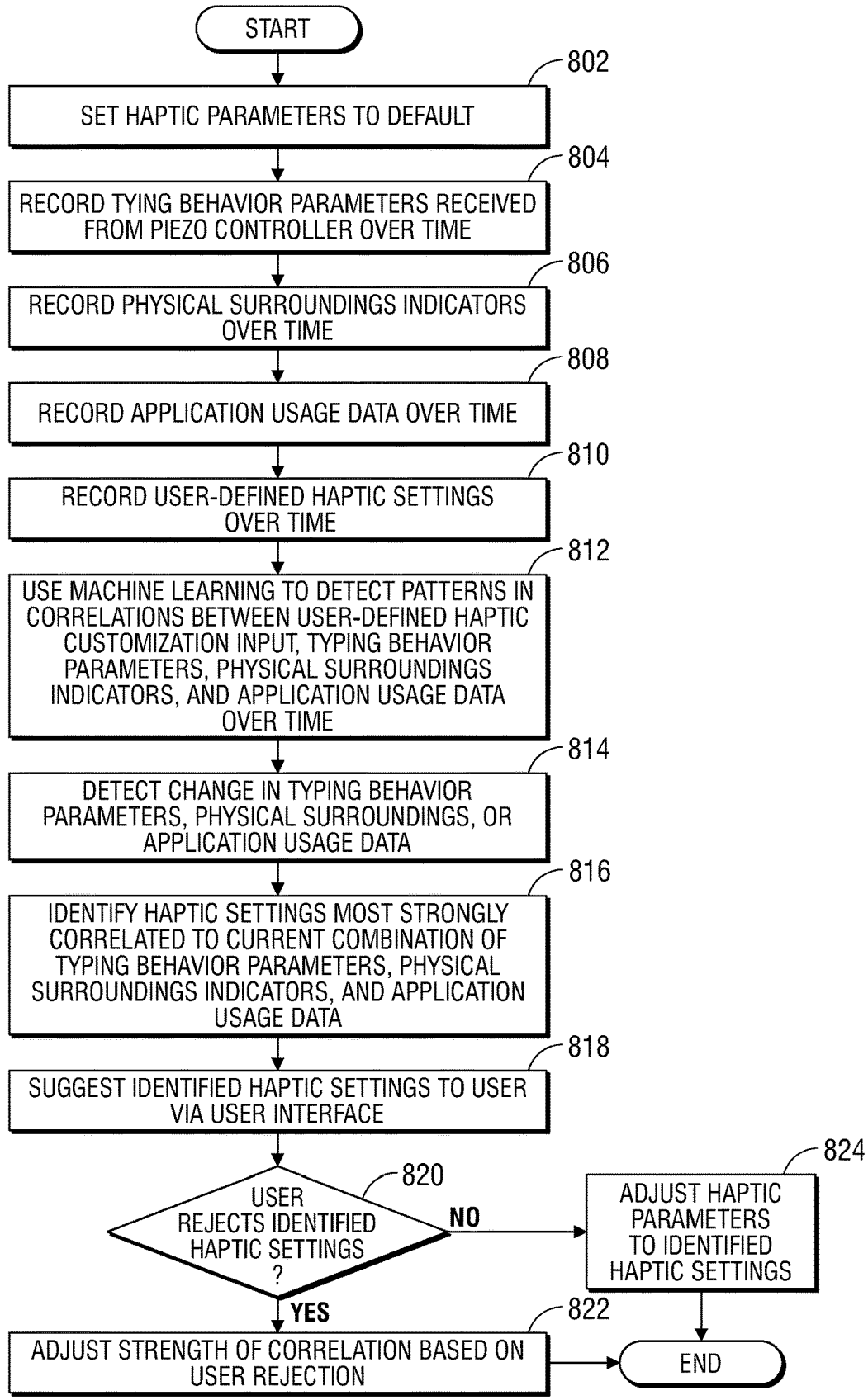
FIG. 8 is a flow diagram illustrating a method of developing a personal typing profile according to an embodiment of the present disclosure.

FIG. 8 is a flow diagram illustrating a method of developing a personal typing profile based on monitored typing behavior, user-defined haptic settings, physical surroundings indicators, or application usage data according to an embodiment of the present disclosure. As described herein, by applying voltage of varying magnitude or polarity to each of the piezo elements in a piezo haptic keyboard assembly in a haptic control feedback signal, a controller may control the factors influencing a user's tactile experience, including the force she must use to depress a key, the speed and force with which each of the keycaps returns to its neutral position after being depressed, and the sound such an interaction generates, among other factors. In contrast to conventional keyboard assemblies, each of these factors may be adjusted, allowing for a wide range of tactile experiences for users. The typing profile personalization system in an embodiment may develop a personal typing profile for an individual user describing optimal settings for each of these adjustable haptic factors, based on correlations made between observed typing behavior parameters for that user, user-defined haptic settings, physical surroundings indicators, or application usage data. Further, the typing profile personalization system may detect when changes in one or more of these observed parameters, settings, indicators, or usage data occur, and either suggest or automatically employ adjustments to the haptic factors to account for changing environmental conditions. By monitoring such information, suggesting changes based on such correlations, and continuing to receive user feedback (e.g., accepting or receiving suggested changes), the typing profile personalization system in an embodiment may develop a personalized typing profile for individual users and cause a controller for any piezo haptic keyboard assembly to operate according to that user's personalized typing profile. This personalized typing profile may also be shifted or adjusted based on detected physical surrounding indicators from sensor such as ambient light, location, microphone, or wireless connection data. Also, the personalized typing profile may also be shifted or adjusted based on the software applications operating on an information handling system from application usage data.

At block 802, the haptic parameters defining dynamics of the piezo haptic keyboard assembly in an embodiment may be set to default values. As described herein, in contrast to conventional keyboard assemblies, each of several haptic factors controlling dynamics of the piezo haptic keyboard may be adjusted, allowing for a wide range of tactile experiences for users. A controller operably connected to each of the piezo elements within a piezo haptic keyboard may receive instructions based on adjustable piezo element settings, and apply those settings to control sensitivity levels of the haptic keys to pressure or location and control the ways in which each of the piezo elements deflects, deforms, or warps during a haptic feedback event. Each of the factors dictating a user's haptic experience may be preset to a default position designed to mimic a conventional keyboard or provide customized haptic feedback, and adjusted by a user via the personal typing profile user interface in an embodiment. The mimicked haptic experience may include actuation of piezo electric elements to feel movement of the key depressing, bottoming, and rebounding as described in embodiments herein. The warping of the piezoelectric elements of the haptic keyboard may initially warp downward, bump at a bottom phase to create a bottomed out feel, and provide a rebound by warping upward in a haptic feedback event mimicking a mechanical keystroke for example. In other embodiments, various vibrations, pulses, bursts, pulsed vibrations, clicks or bumps or other haptic elements may be utilized for haptic feedback events and depend on the haptic control feedback signal provided to the piezo electric element for a haptic key. In some embodiments, a user may already be associated with a personal typing profile. For example, the personal typing profile for a given user may be stored locally on the information handling system operating the typing profile personalization system, or may be stored remotely in a cloud-based storage system. In such embodiments, the personal typing profile for that user may be downloaded or accessed in lieu of default settings. The typing profile personalization system in such an embodiment may generate a preliminary set of piezo haptic settings using this personal typing profile and one or more detected behavioral parameters, environmental indicators, or application usage data metrics.

The typing profile personalization system in an embodiment may record typing behavior parameters received from the piezo controller over time at block 804. For example, in an embodiment described with respect to FIG. 6, the piezo controller 651 in an embodiment may transmit haptic hardware typing behavior parameters 610 to the typing profile personalization system 626, including metrics describing how a user interacts with the keyboard and touchpad. The piezo controller 651 in an embodiment may monitor changes in voltage magnitude or polarity (e.g., 607 or 609) occurring upon deflection of a plurality of piezo elements (e.g., 606 and 608) in an embodiment, indicating occurrence of keystrokes or clicks of a touch pad. The voltage changes 607 and 609 in embodiments may further indicate the degree to which the piezo elements 606 and 608 deflected, indicating the force with which the user depressed the key or the touchpad situated atop the piezo elements 606 and 608. Further, by monitoring such voltage changes (e.g., 607 and 609) for each of the plurality of piezo elements within the piezo element layer in an embodiment, and aggregating such notifications over time, the piezo controller 651 may identify the locations of keystrokes and clicks for given keys or the touch pad (e.g., roughly within the center of the key or touch pad, or corner strikes), an average duration of keystrokes or touch pad clicks, pauses or intervals in typing, and an overall typing speed as haptic hardware typing behavior parameters 610 detected by the haptic keyboard piezo controller 651. In some embodiments, the haptic keyboard piezo controller 651 may detect and log occurrences when a corner strike is detected and immediately followed by the user pressing backspace or delete. In such an embodiment, the keyboard piezo controller 651 may also categorize these occurrences as potential mistypes, prompting a need for decreased sensitivity of corner strikes at one or more piezo elements. Changes in one or more of these metrics in an embodiment may indicate a change in users, a change in user mood, or a change in user-desired haptic response. For example, greater force in keystrokes or increased typing speed may indicate a higher level of stress, or may indicate the user would prefer a louder haptic response. These metrics may then be transmitted to the typing profile personalization system 626 as typing behavior parameters 610 in an embodiment.

At block 806, the typing profile personalization system in an embodiment may record physical surroundings indicators over a period of time. For example, in an embodiment described with reference to FIG. 6, the typing profile personalization system 626 may receive physical surroundings indicators 630 from one or more environmental sensors such as time of day from a clock system of the information handling system, camera 632, location sensor 634, network interface device 636, or microphone 638 in but a few examples of system environmental sensors that may be used. Images captured by the camera 632 in an embodiment, for example, may describe a user's ambient surroundings, such as whether the user is in a crowded or secluded environment, whether the user is working in a darkened room or outside during the day, or whether the user's biometric measurements indicate the user is stressed, fatigued, or relaxed, for example. Each of these factors may influence the way in which the user wishes to interact with the piezo haptic keyboard in an embodiment. As another example, location data as measured by a location sensor 634 may be included within the physical surroundings indicators 630. A user may adjust the settings of the piezo haptic keyboard in an embodiment based, at least in part, on the user's location.

As yet another example, the network interface device 636 of the information handling system may transmit an identification of a wired or wireless network with which it has established a connection. Such information may be used to identify the location of the user, or to establish that the user is in transit, which may prompt a change in piezo haptic keyboard settings. For example, a user may desire a quieter haptic response from the keyboard while travelling by plane alongside other passengers. In still another example, a microphone 638 may capture ambient sound surrounding the information handling system, or may capture voice commands spoken aloud by a user in some embodiments. Ambient sound may indicate whether a user is in a relatively secluded space or in a crowded area surrounded by other people, or that the user is engaged in an audio conversation with another person located within the same room, via a phone not included within the information handling system, or via a voice conferencing application running on the information handling system. Each of these indicators may influence the haptic response most preferred by a user at a given time. For example, a user may desire a louder haptic response in an embodiment when she is in a relatively noisy environment, and a quieter haptic response when she is in a relatively quiet environment (e.g., library), or engaged in an audio conversation. Receipt of such physical surroundings indicators 630 by the typing profile personalization system 626 in an embodiment may allow the typing profile personalization system 626 to gauge the user's environmental surroundings at a given time, including a time when a user makes changes to the user-defined haptic settings 604.

The typing profile personalization system in an embodiment may record application usage data over time at block 808. For example, in an embodiment described with reference to FIG. 6, the typing profile personalization system 626 in an embodiment may receive application usage data 640 from one or more applications (e.g., a sound sensitive software application 642 or a hot key software application 644) running on the information handling system. A sound sensitive software application 642 may be one that operates best in quieter ambient surroundings, such as, for example, audio and video conferencing applications. A hot key software application 644 in an embodiment may include applications that employ one or more keys or the touch pad to perform an action within the application, other than typing of the letter represented by the key. In other embodiments, the application usage data 640 may also include information such a user's calendar or itinerary, which the typing profile personalization system may analyze to determine periods of time in which changes to haptic response may be needed. For example, the typing profile personalization system may determine the piezo haptic keyboard settings should be set to a quietest possible setting during an hour in which the user has scheduled a conference call. Preferred haptic response in an embodiment may vary based on whether one or more of these applications 642 or 644 are in active operation.

At block 810, the typing profile personalization system in an embodiment may record user-defined haptic settings over time. For example, in an embodiment described with reference to FIG. 6, the typing profile personalization system 626 in an embodiment may receive user-defined haptic settings 604 from the personal typing profile user interface 602. An example embodiment of a personal typing profile user interface is shown in FIG. 5 but may take any form of user interface. As described herein, a user may adjust several factors governing dynamics of the piezo haptic keyboard assembly, including, for example, the force threshold required for the controller to register that a keystroke has occurred, and the size of the area in which the user must apply such a force in order for the controller to register a keystroke. As another example, a user may adjust the intensity, duration, and sharpness at which a piezo element moves between an upward warped position, downward position, or neutral position following registering a keystroke, and the burst count and interval of sustained movements occurring in response to use of specific applications. As the user adjusts one or more of these settings in an embodiment, the personal typing profile user interface 602 may transmit these user-defined haptic settings 604 to the typing profile personalization system 626 to indicate a user's preferences at a given time.

At block 812, the typing profile personalization system may use a typing profile machine learning module to detect patterns in correlations between user-defined haptic customization input, typing behavior parameters, physical surroundings indicators, and application usage data over time in an embodiment. The typing profile machine learning module in an embodiment may determine such correlations in an embodiment based on any machine learning or neural network methodology known in the art or developed in the future. For example, the typing profile machine learning module in an embodiment may model the relationships between each of the typing behavior parameters, user-defined haptic settings, physical surroundings indicators, and application usage data using a layered neural network topology. Such a neural network in an embodiment may include an input layer including a known, recorded set of values for each of these parameters, settings, indicators, and usage data metrics, and an output layer including a projected optimal set of values for each of piezo haptic settings, based on the known, recorded set of values in the input layer. The typing profile machine learning module in an embodiment may forward propagate through the layers of the neural network to project or predict optimal piezo haptic settings based on the known and recorded parameters, settings, indicators, and usage data metrics, and compare these projected values to user-selected optimal piezo haptic settings. Using a back-propagation method, the typing profile machine learning module in an embodiment may then use the difference between the projected values and the known optimal values to adjust weight matrices of the neural network describing the ways in which changes in each of the parameters, settings, indicators, and usage data metrics are likely to affect each of the optimal piezo haptic settings. With the output layer, the typing profile personalization system may provide learned, custom haptic settings that are determined to be optimal piezo haptic settings for the user based on the user-defined haptic settings if any have been designated and based upon the haptic hardware typing behavior parameters detected during use of the haptic keyboard. These resulting learned, custom haptic settings may be suggested to a user or automatically implemented. Suggestion may come with an indicator and be shown in a graphic user interface for approval by the user before implementation. In some embodiments, the personal typing profile may include many combinations of haptic settings that may be optimal depending on physical surrounding indicators or application usage data indicating what types of applications are operating. For example, the personal typing profile may include one set of learned, custom haptic settings when physical environmental indicators indicate daytime, or working hours while a different set of learned, custom haptic settings may be used for evening information handling system usage. Combinations of physical surrounding indicators and application usage data indicating applications operating may adjust or change the learned, custom haptic settings implemented from a personal typing profile in various embodiments.

The typing profile machine learning module in an embodiment may perform this forward propagation and backward propagation, using different input node values repeatedly to finely tune the weight matrices. In such a way, the typing profile machine learning module in an embodiment may adaptively learn how changes in these parameters, settings, indicators, and usage data metrics may affect an individual user's optimal piezo haptic settings. The weight matrices associated with the layers of the neural network model in such an embodiment may describe, mathematically, these correlations for an individual user. The neural network model (including designation of the node values in the input layer, and number of layers), along with the weight matrices associated with each layer in an embodiment may form a personal typing profile for an individual user.

At block 814, the typing profile personalization system may detect a change in typing behavior parameters, physical surroundings, or application usage data. For example, in an embodiment described with respect to FIG. 6, once the typing profile machine learning module applies a machine learning methodology to develop a personal typing profile for an individual user, the typing profile personalization system may detect changes to any of these influencing factors, and notify the typing profile machine learning module. The typing profile machine learning module may respond by either suggesting or automatically applying changes to one or more of the factors controlling the user's haptic experience of the piezo haptic keyboard assembly. For example, the typing profile personalization system 626 in an embodiment may continuously monitor incoming typing behavior parameters 610, physical surroundings indicators 630, and application usage data 640, and notify the typing profile machine learning module 627, which may determine when one of these factors warrants a change to the user-defined haptic settings 604 to a learned, custom piezo haptic setting optimal for a user. The learned, custom piezo haptic setting may include both learned aspects and user-defined settings in embodiments herein.

The typing profile machine learning module may identify haptic settings most strongly correlated to a current combination of typing behavior parameters, physical surroundings indicators, and application usage data in an embodiment at block 816. For example, in an embodiment described with reference to FIG. 6, the typing profile machine learning module system 627 may input the newly recorded or altered typing behavior parameters 610, physical surroundings indicators 630, and application usage data 640 detected at block 814 in the input layer of the neural network, and forward propagate to identify projected optimal piezo haptic keyboard settings in the output layer. The output (e.g., projected optimal learned, custom piezo haptic keyboard settings) in an embodiment may be determined based on the weight matrices unique to the individual user, thus producing optimal personalized settings.

At block 818, the typing profile personalization system or the personal typing profile user interface in an embodiment may suggest identified learned, custom piezo haptic settings to the user. For example, in an embodiment described with reference to FIG. 6, the typing profile machine learning module 627 may transmit the projected optimal learned, custom piezo haptic settings to the typing profile personalization system 626, which may transmit the projected optimal piezo haptic settings, determined through forward propagation of the neural network described with respect to block 816 as a suggested haptic settings update 660 to the personal typing profile user interface 602. The typing profile user interface 602 in such an embodiment may display the suggested changes, and allow the user to choose whether to apply such suggested changes or to decline such changes. In some embodiments, the typing profile personalization system 626 may notify the user the changes will occur automatically unless the user declines such a change during a preset duration of time. In other embodiments, the typing profile personalization system 626 may automatically apply the changes, without notifying the user.

The typing profile personalization system may determine at block 820 in an embodiment whether the user has rejected the suggested learned, custom piezo haptic settings. For example, in an embodiment in which the typing profile personalization system displays the suggested changes to the piezo haptic settings, the user may decline such changes via a graphical user interface. In another embodiment, in which the typing profile personalization system automatically initiates the learned, custom piezo haptic setting changes without notifying the user, the user may readjust the piezo haptic settings using the personal typing profile user interface. If the user makes such a readjustment within a preset time period of the typing profile personalization system automatically adjusting the piezo haptic settings in an embodiment, the typing profile personalization system may identify this readjustment as a rejection of the automatically applied adjustment to the piezo haptic settings performed by the typing profile personalization system. If the user rejects the suggested or automatically instated adjustment to the learned, custom piezo haptic settings, this suggests the current neural network model does not accurately gauge optimal piezo haptic settings for the individual user in the current situation, and the method may proceed to block 822 for adjustment of the personal typing profile for that individual user. If the user does not reject the suggested or automatically applied adjustment to the learned, custom piezo haptic settings, this suggests the current neural network model accurately gauges optimal piezo haptic settings for the individual user in the current situation, and the method may proceed to block 824.

At block 822, the typing profile personalization system in an embodiment in which the user rejects the suggested changes to the haptic settings may adjust the strength of the correlation made between the suggested changes to the learned, custom piezo haptic settings, and the current combination of typing behavior parameters, physical surroundings indicators, and application usage data. For example, if the user rejects the projected optimal learned, custom piezo haptic settings determined in the output layer of the personal typing profile neural network for that user, this may indicate the weight matrices (e.g., correlations between typing behavior parameters, physical surroundings indicators, application usage data, and optimal learned, custom piezo haptic settings for that user) need to be adjusted. In such an embodiment, the typing profile personalization system may compare the piezo haptic settings the user chooses to apply instead of the learned, custom piezo haptic settings suggested at block 818 and rejected at block 820 to determine an error value, and back propagate this error through the layers of the neural network to adjust the weight matrices. In such a way, the typing profile personalization system in an embodiment may adaptively and continuously learn how changes in these parameters, indicators, and usage data metrics may affect an individual user's choice of optimal piezo haptic settings.

In an embodiment in which the user does not reject the suggested learned, custom piezo haptic settings, the typing profile personalization system at block 824 may automatically adjust the haptic parameters to the identified and suggested learned, custom piezo haptic settings. For example, in an embodiment described with reference to FIG. 6, the typing profile personalization system 626 may transmit updated learned, custom haptic settings 670 to the piezo controller 651. The updated learned, custom haptic settings 670 may correlate to the optimal piezo haptic settings produced in the output layer of the neural network model. For example, by setting the voltage that must be transmitted by the piezo element 606 or the piezo element 608 to the controller 651 in order for the controller 651 to register that a keystroke has occurred in an embodiment, based on the received updated learned, custom haptic settings 670, the controller 651 may set the downward force required to register a keystroke or a click of the touch pad, as well as roughly define the area (e.g., in the center of the key or touch pad, or on the edges of the key or touch pad) in which a user must apply that force. As another example, the controller 651 may set the intensity or force with which a key provides a haptic movement (e.g., moving between an upward warped position, downward warped position, or neutral position) following a keystroke, based on the received updated learned, custom haptic settings 670, by varying the magnitude or polarity of voltage applied to the piezo element 606 that causes the warping in either the upward or downward position. The controller 651 in another example may set the duration of such a haptic movement, and the sharpness of such a movement, based on the received updated learned, custom haptic settings 670, by setting the duration of time between detection of the keystroke and deflection of the piezo element 606 to its neutral position, or to a position in which it deflects upward and away from the base support plate. In still another example, the controller 651 may set hot buttons or controller keys to control the duration of hot key haptic movement bursts, and the interval between such bursts, based on the received updated learned, custom haptic settings 670, by setting the number of voltage pulses, and the timing between them that the contact foil applies to the piezo element 606 or the piezo element 608.

The method may then end. In such a way, by monitoring typing behavior parameters, user-defined haptic settings, physical surroundings indicators, and application usage data, suggesting changes based on such correlations, and continuing to receive user feedback (e.g., accepting or receiving suggested changes), the typing profile personalization system may develop a personalized typing profile for an individual user and cause a controller for any piezo haptic keyboard assembly to operate according to that user's personalized typing profile.

The blocks of the flow diagrams of FIGS. 7-8 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A haptic keyboard typing profile personalization system of an information handling system comprising:
 a processor executing machine readable code instructions to:
  receive, over the period of time, a plurality of haptic hardware typing behavior parameter values for a user via a piezo haptic keyboard controller indicating keystrike force or duration of key strikes; and
  input, as an input layer, the plurality of haptic hardware typing behavior parameter values for a personal typing profile into code instructions of a machine learning algorithm executing a neural network for correlating the input layer with one or more haptic setting values defining haptic feedback movement of one of a plurality of piezo electric elements of a haptic keyboard;
 the processor executing the code instructions of the machine learning algorithm configured to identify an output layer describing the personal typing profile with learned, custom haptic setting values for the one or more haptic setting values optimized for the user; and the piezo haptic keyboard controller applying a voltage of specific magnitude, polarity, or duration to a contact foil layer operably connecting the piezo haptic keyboard controller to a piezo electric element of the haptic keyboard to cause the piezo electric element to operate according to the personally typing profile learned, custom haptic setting values to detect keystrokes and provide haptic feedback to the haptic keyboard.

2. The haptic keyboard typing profile personalization system of claim 1, wherein input layer of code instructions of the machine learning algorithm comprises weight matrices of the neural network and the processor forward propagates the input layer through the neural network to identify the output layer describing the personal typing profile with learned, custom haptic setting values.

3. The haptic keyboard typing profile personalization system of claim 1, wherein one of the plurality of haptic hardware typing behavior parameter values includes an indication of a high level of keystrike force and the updated learned, custom haptic setting values is an increased force threshold setting to register a keystroke.

4. The haptic keyboard typing profile personalization system of claim 1, wherein one of the plurality of haptic hardware typing behavior parameter values includes an indication of a high level of keystrike force and the updated learned, custom haptic setting values is an increased haptic movement intensity setting in a haptic feedback control signal for the haptic feedback to the haptic keyboard.

5. The haptic keyboard typing profile personalization system of claim 1, wherein one of the plurality of haptic hardware typing behavior parameter values includes an indication of a short duration of keystrike and the updated learned, custom haptic setting values is a decreased force threshold setting to register a keystroke and a decreased haptic movement intensity setting in a haptic feedback control signal for the haptic feedback to the haptic keyboard.

6. The haptic keyboard typing profile personalization system of claim 1 further comprising:
the processor to receive, over a period of time, a plurality of user-defined haptic setting values defining haptic feedback movement of a plurality of piezo electric elements;
the processor determine if the plurality of user-defined haptic setting values defining haptic feedback movement of the plurality of piezo electric elements overrides the output layer describing the personal typing profile and providing updated learned, custom haptic setting values for the one or more haptic setting values according to the user-defined haptic setting values.

7. The haptic keyboard typing profile personalization system of claim 1 further comprising:
the processor to receive, over a period of time, a plurality of user-defined haptic setting values defining haptic feedback movement of a plurality of piezo electric elements;
the processor to input as an input layer, the plurality of user-defined haptic setting values defining haptic feedback movement of the plurality of piezo electric elements into the personal typing profile and updating the output layer describing the personal typing profile with updated learned, custom haptic setting values for the one or more haptic setting values optimized for the user.

8. The haptic keyboard typing profile personalization system of claim 1 further comprising:
the processor to receive, over the period of time, a plurality of physical surrounding indicator values via an operably connected environmental sensor and a plurality of application usage data values via a software application operating on the information handling system;
the processor to input as an input layer, the plurality of physical surrounding indicator values and the plurality of application usage data values into the personal typing profile and updating the output layer describing the personal typing profile with updated learned, custom haptic setting values for the one or more haptic setting values optimized for the user.

9. The haptic keyboard typing profile personalization system of claim 8, wherein one of the plurality of physical surrounding indicator values includes an indication of low ambient noise and the updated learned, custom haptic setting values is a decreased force threshold setting.

10. A haptic keyboard typing profile personalization system of an information handling system comprising:
a processor executing machine readable code instructions to:
receive, over the period of time, a plurality of haptic hardware typing behavior parameter values for a user via a piezo haptic keyboard controller indicating keystrike force or duration of key strikes;
receive, a plurality of user-defined haptic setting values defining haptic feedback movement of a plurality of piezo electric elements; and
input, as an input layer, the plurality of haptic hardware typing behavior parameter values and user-defined haptic setting values for a personal typing profile into code instructions for a machine learning algorithm executing a neural network for correlating the input layer with one or more haptic setting values defining haptic feedback movement of the plurality of piezo electric elements of a haptic keyboard;
the processor executing the code instructions of the machine learning algorithm configured to identify an output layer describing the personal typing profile with learned, custom haptic setting values for the one or more haptic setting values optimized for the user; and
the piezo haptic keyboard controller applying a voltage of specific magnitude, polarity, or duration to a contact foil layer operably connecting the piezo haptic keyboard controller to a piezo electric element of the haptic keyboard to cause the piezo electric element to operate according to the personally typing profile learned, custom haptic setting values to detect keystrokes and provide haptic feedback to the haptic keyboard.

11. The haptic keyboard typing profile personalization system of claim 10, wherein input layer of the code instructions for the machine learning algorithm comprises weight matrices of the neural network and the processor forward propagates the input layer through the neural network to identify the output layer describing the personal typing profile with learned, custom haptic setting values.

12. The haptic keyboard typing profile personalization system of claim 10, wherein one of the plurality of haptic hardware typing behavior parameter values includes an indication of a high level of keystrike force and the updated learned, custom haptic setting values is an increased force threshold setting to register a keystroke.

13. The haptic keyboard typing profile personalization system of claim 10, wherein one of the plurality of user-defined haptic setting values defining haptic feedback movement of a plurality of piezo electric elements includes a setting for increased keystrike force threshold to decrease sensitivity and errors in typing and the updated learned, custom haptic setting values yields an increased force threshold and an increased haptic movement intensity setting in a haptic feedback control signal for the haptic feedback to the haptic keyboard.

14. The haptic keyboard typing profile personalization system of claim 10 further comprising:
the processor to receive, over the period of time, a plurality of physical surrounding indicator values via an operably connected environmental sensor and a plurality of application usage data values via a software application operating on the information handling system;
the processor to input as an input layer, the plurality of physical surrounding indicator values and the plurality of application usage data values into the personal typing profile and updating the output layer describing the personal typing profile with updated learned, custom haptic setting values for the one or more haptic setting values optimized for the user.

15. The haptic keyboard typing profile personalization system of claim 10, wherein one of the plurality of physical surrounding indicator values includes an indication the user is engaged in a conversation and the updated learned, custom haptic setting values is a decreased force threshold setting.

16. A haptic keyboard typing profile personalization system of an information handling system comprising:
a processor executing machine readable code instructions to:
the processor to receive, over a period of time, a plurality of user-defined haptic setting values defining haptic feedback movement of a plurality of piezo electric elements;
the processor to set the plurality of user-defined haptic setting values defining haptic feedback movement of the plurality of piezo electric elements as a personal typing profile and providing learned, custom haptic setting values for the one or more haptic setting values according to the user-defined haptic setting values; and
the piezo haptic keyboard controller applying a voltage of specific magnitude, polarity, or duration to a contact foil layer operably connecting the piezo haptic keyboard controller to a piezo electric element of the haptic keyboard to cause the piezo electric element to operate according to the personally typing profile learned, custom haptic setting values to detect keystrokes and provide haptic feedback to the haptic keyboard.

17. The haptic keyboard typing profile personalization system of claim 16 further comprising:
receive, over the period of time, a plurality of haptic hardware typing behavior parameter values for a user via a piezo haptic keyboard controller indicating keystrike force or duration of keystrikes;
input, as an input layer, the plurality of haptic hardware typing behavior parameter values and the plurality of user-defined haptic setting values for a personal typing profile into code instructions of a machine learning algorithm executing a neural network for correlating the input layer with one or more haptic setting values defining haptic feedback movement one of a plurality of piezo electric elements of a haptic keyboard;
the code instructions of the machine learning algorithnm to identify an output layer describing the personal typing profile with updated learned, custom haptic setting values for the one or more haptic setting values optimized for the user.

18. The haptic keyboard typing profile personalization system of claim 17, wherein the output layer of the code instructions of machine learning algorithm updates the personal typing profile with updated learned, custom haptic setting values for the one or more haptic setting values optimized for the user is suggested to the user via a haptic setting graphical user interface.

19. The haptic keyboard typing profile personalization system of claim 16 further comprising:
the processor to receive, over the period of time, a plurality of physical surrounding indicator values via an operably connected environmental sensor and a plurality of application usage data values via a software application operating on the information handling system;
the processor to adjust the personal typing profile and provide updated learned, custom haptic setting values for the one or more haptic setting values according to the plurality of physical surrounding indicator values and the plurality of application usage data values according to the personal typing profile.

20. The haptic keyboard typing profile personalization system of claim 16, wherein the plurality of user-defined haptic setting values defining haptic feedback movement of the plurality of piezo electric elements includes force threshold detection level setting, haptic feedback intensity settings, haptic feedback duration settings or haptic feedback sharpness settings.

* * * * *